United States Patent
Pratt

(10) Patent No.: US 9,660,675 B2
(45) Date of Patent: May 23, 2017

(54) DIGITAL PREDISTORTION AND UPTILT AND CABLE COMMUNICATION

(71) Applicant: Analog Devices Global, Hamilton (BM)

(72) Inventor: Patrick Pratt, Mallow (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/982,701

(22) Filed: Dec. 29, 2015

(65) Prior Publication Data
US 2017/0104502 A1    Apr. 13, 2017

Related U.S. Application Data

(60) Provisional application No. 62/240,706, filed on Oct. 13, 2015.

(51) Int. Cl.
*H04L 25/03* (2006.01)
*H04B 1/04* (2006.01)
(Continued)

(52) U.S. Cl.
CPC ............ *H04B 1/0475* (2013.01); *H03F 3/19* (2013.01); *H03F 3/245* (2013.01); *H03M 1/12* (2013.01); *H03M 1/66* (2013.01); *H04L 27/368* (2013.01); *H03F 2200/451* (2013.01); *H04B 2001/0425* (2013.01)

(58) Field of Classification Search
CPC . H04L 27/368; H04L 25/03343; H04L 25/08; H03F 1/3247; H03F 2201/3233; H03F 2200/165; H03F 2201/3215; H04B 17/13; H04B 1/0475

USPC .............. 375/297, 135, 295, 350; 455/114.2, 455/114.3, 63.1
See application file for complete search history.

(56) References Cited

U.S. PATENT DOCUMENTS

| 3,978,422 A | 8/1976 | Rheinfelder |
| 6,112,062 A | 8/2000 | Hans et al. |

(Continued)

FOREIGN PATENT DOCUMENTS

EP    1819039 A    8/2007

OTHER PUBLICATIONS

"Presentation on Digital Predistortion of Power Amplifiers", © 2008 Agilent Technologies, Inc. [online]. Retrieved from the Internet: <URL: www.agilent.com/find/eesof>, (Jun. 2001), 33 pgs.

(Continued)

*Primary Examiner* — Leila Malek
(74) *Attorney, Agent, or Firm* — Schwegman Lundberg & Woessner, P.A.

(57) ABSTRACT

Otherwise incompatible digital predistortion and uptilt can be used together, such as in a cable television or other cable communications system having a frequency-dependent signal loss at high frequencies. The predistortion can be used to compensate for a nonlinear gain compression of a power amplifier at higher frequencies. Additional uptilt and equalizer circuits can be included to address deleterious distortion effects that may otherwise arise by using predistortion and uptilt together. Training and adaptation of various components are described. Fine and coarse uptilt adjustments can be provided.

28 Claims, 16 Drawing Sheets

(51) Int. Cl.
    *H04L 27/36*    (2006.01)
    *H03F 3/24*     (2006.01)
    *H03F 3/19*     (2006.01)
    *H03M 1/66*     (2006.01)
    *H03M 1/12*     (2006.01)

(56) References Cited

U.S. PATENT DOCUMENTS

| | | | |
|---|---|---|---|
| 6,232,836 B1 | 5/2001 | Zhou | |
| 6,342,810 B1 | 1/2002 | Wright et al. | |
| 6,985,033 B1 | 1/2006 | Shirali et al. | |
| 8,577,311 B2 | 11/2013 | Wolf et al. | |
| 2005/0025323 A1* | 2/2005 | Botti | H03F 1/0277 381/120 |
| 2006/0158254 A1* | 7/2006 | Johnson | H03F 1/3247 330/149 |
| 2008/0218262 A1 | 9/2008 | Ziegler et al. | |
| 2009/0261899 A1 | 10/2009 | Gomez et al. | |
| 2010/0271125 A1* | 10/2010 | Ohba | H03F 1/3247 330/149 |
| 2010/0329325 A1* | 12/2010 | Mobin | H04L 25/03343 375/232 |
| 2014/0269987 A1* | 9/2014 | Gubeskys | H04L 27/2624 375/296 |
| 2014/0355714 A1 | 12/2014 | Cheng et al. | |
| 2014/0362900 A1* | 12/2014 | Sperlich | H04L 25/026 375/232 |

OTHER PUBLICATIONS

"European Application Serial No. 16193368.4, Extended European Search Report mailed Mar. 7, 2017"; 9 pgs.

* cited by examiner

DIGITAL PREDISTORTION AND UPTILT AND CABLE COMMUNICATION

CLAIM OF PRIORITY

This patent application claims the benefit of priority of U.S. Provisional Patent Application No. 62/240,706, filed on Oct. 13, 2015, entitled ULTRA WIDE BAND DIGITAL PRE-DISTORTION, which is incorporated herein by reference, and the benefit of priority of which is claimed herein.

TECHNICAL FIELD

This document pertains generally, but not by way of limitation, to integrated circuits and communication systems, and particularly, but not by way of limitation to digital predistortion and "uptilt" signal frequency modification, such as for (but not limited to) cable network communication.

BACKGROUND

Radiofrequency (RF) communications, such as for mobile telephony, may use an RF power amplifier (PA) circuit in an RF transmitter to produce the RF signal for transmission over the air to an RF receiver. The PA circuit may have a nonlinear gain characteristic, such as gain compression occurring at higher power output levels, which can lead to signal distortion at such higher power levels.

U.S. Pat. No. 6,342,810, for example, mentions a method of compensating for amplifier nonlinearities by using predistortion to apply an inverse model of the amplifier's transfer characteristic to an input signal of the amplifier. A goal of such predistortion is to obtain a PA circuit output signal that has reduced or no distortion due to the PA circuit gain nonlinearity.

OVERVIEW

The present inventors have recognized, among other things, that allowing a power amplifier (PA) circuit to operate including in its nonlinear (e.g., gain compression) region, such as by using predistortion compensation, can provide one or more benefits, such as to improve amplifier efficiency and performance, reduce power consumption, reduce waste heat generation, and reduce or avoid the need for active or passive cooling of the power amplifier circuit, but that certain communication systems (e.g., cable network communications) can present additional challenges that make certain approaches to predistortion difficult or even deleterious. Cable network communications standards impose strict requirements on maximum allowable distortion and linearity, such as to avoid interference with other channels at adjacent or nearby frequencies, which interference, in turn, can interfere with the ability of a cable receiver to decode the received signal. For example, the signal-to-noise ratio (SNR) requirements for cable network communications can be an order of magnitude more strenuous than corresponding SNR requirements in the cellular communications industry.

For example, a PA circuit that drives a cable of a cable television communications network faces the additional challenge. The cable can present a load to the PA circuit that exhibits a frequency dependent signal loss, such as can be characterized for a particular cable. For example, a cable may exhibit a high frequency rolloff characteristic of about 2 decibels of signal amplitude reduction per 100 MHz of frequency, such as at frequencies above 50 MHz. One approach to reducing signal loss through the cable is to apply an "uptilt" frequency modification to a signal that is input into the PA circuit, so that the resulting output signal from the PA circuit is frequency compensated at its destination after being transmitted across the cable. However, by itself, such uptilt frequency modification can be fundamentally incompatible with—and even deleterious to—digital predistortion (DPD) of the PA circuit, as explained herein. This document explains, among other things, examples of approaches for overcoming such technical challenges, such as to allow digital predistortion to compensate for PA circuit gain compression at higher power levels, together with frequency modification, such as uptilt frequency modification to compensate for signal loss through a cable, such as a cable of a cable television communications network.

Among other things, this document explains how otherwise incompatible digital predistortion and uptilt can be used together, such as in a cable television or other cable communications system having a frequency-dependent signal loss at high frequencies. The predistortion can be used to compensate for a nonlinear gain compression of a power amplifier at higher frequencies. Additional uptilt and equalizer circuits can be included to address deleterious distortion effects that may otherwise arise by using predistortion and uptilt together. Training and adaptation of various components are described. Fine and coarse uptilt adjustments can be provided.

This overview is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

FIGS. 12-1, 12-2, and 12-3 show computer simulation data of power spectral density (dBc/Hz) vs. frequency, graphed at various nodes of the system of FIG. 6.

DETAILED DESCRIPTION

Figure 1:
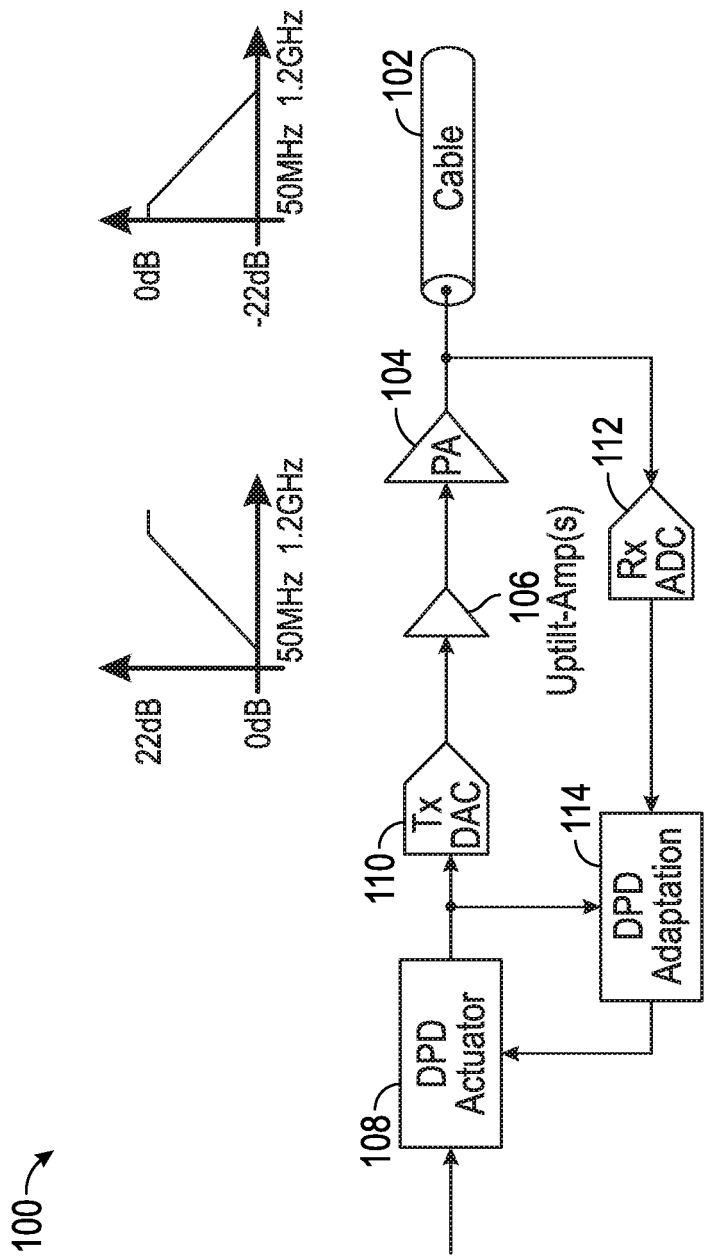
FIG. 1 shows an example of an approach of a system for compensating for a frequency dependent signal loss (e.g., −2 dB/100 MHz for frequencies exceeding 50 MHz) of a cable of a cable television network.

FIG. 1 shows an example of an approach of a system 100 for compensating for a frequency dependent signal loss (e.g., −2 dB/100 MHz for frequencies exceeding 50 MHz) of a cable 102 of a cable television network. The cable 102 can be driven by a signal output by a power amplifier (PA) circuit 104. An analog frequency modification "uptilt" filter circuit 106 can be placed in the signal path before the PA circuit 104. The analog uptilt RF equalizer filter circuit 106 can provide pre-emphasis having a highpass frequency gain expansion characteristic (e.g., +2 dB/100 MHz amplification for frequencies exceeding 50 MHz) of a cable to offset or compensate for the lowpass frequency dependent signal loss of the cable 102.

For compensating a nonlinear gain compression of the PA circuit 104 at high power levels, a nonlinear predistortion circuit can be placed in the signal path before the PA circuit 104. For example, a nonlinear digital predistortion circuit 108 can be followed in the signal path by a transmit (Tx) digital-to-analog converter (DAC) circuit 110, which can be followed in the signal path by the analog uptilt filer circuit 106, which, in turn, can be followed in the signal path by the PA circuit 104. Since the nonlinear gain compression of the PA circuit 104 can vary over time and operating conditions, a feedback loop can be used to monitor an output of the PA circuit 104. Information monitored at the output of the PA circuit 104 can be fed back to modify or vary the predistortion applied by the DPD circuit 108. For example, a signal output by the PA circuit 104 can be fed back through a receive (Rx) analog-to-digital converter (ADC) circuit 112, to a DPD adaptation circuit 114 that can perform digital signal processing (DSP) and that can be coupled to the DPD circuit 108 such as to control the predistortion applied by the DPC circuit 108.

Figure 2:
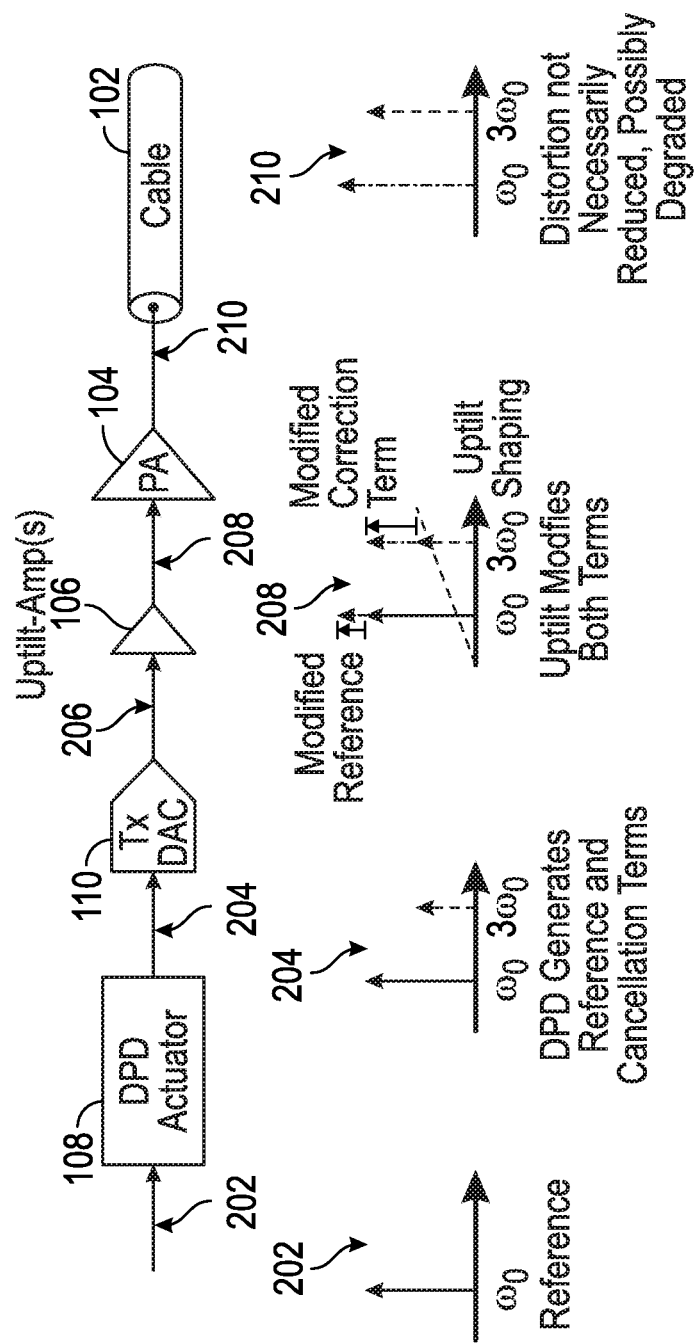
FIG. 2 explains how the linear frequency modification of the uptilt filter circuit of FIG. 1 (intended to compensate for the frequency characteristic of the cable) can interfere and be incompatible with the nonlinear DPD circuit (intended to compensate for the nonlinear gain compression of the PA circuit).

FIG. 2 explains how the linear frequency modification of the uptilt filter circuit 106 (intended to compensate for the frequency characteristic of the cable 102) can interfere and be incompatible with the nonlinear DPD circuit 108 (intended to compensate for the nonlinear gain compression of the PA circuit 104). Although in practice a broadband signal is applied to the system 100 for driving the cable 102, FIG. 2 shows an example, for conceptual ease of illustration, in which the signal input to the system 100, at 202, is a narrowband signal at a single reference frequency $\omega_o$ having an amplitude such as illustrated conceptually in FIG. 2 The DPD circuit 108 applies a predistortion, yielding a signal, at 204, having a component at the reference frequency $\omega_o$ and a PA correction component at a harmonic of the reference frequency, $3\omega_o$, having amplitudes such as illustrated conceptually in FIG. 2. The correction component at the harmonic of the reference frequency, $3\omega_o$, is intended to conceptually illustrate the predistortion component being introduced by the DPD circuit 108 to compensate for the nonlinear gain compression of the PA circuit 104.

The predistorted signal at 205 is fed into the Tx DAC circuit 110 and, in turn, fed at 206 to an input of the uptilt filter circuit 106, with the resulting signal at the output 208 of the uptilt circuit 106 shown conceptually in FIG. 2. The uptilt circuit 106 will modify both the reference component, at the reference frequency $\omega_o$ and the PA correction component at a harmonic of the reference frequency, $3\omega_o$, with the correction component being amplified more than the reference component because of the uptilt (highpass) frequency response of the uptilt circuit 106, such as shown conceptually in FIG. 2. The modification of the reference component at the reference frequency $\omega_o$ is desired—it represents the desired uptilt compensation for the cable signal loss at high frequencies in the cable 102. But the uptilt modification of the PA correction component at $3\omega_o$ can be detrimental to the goal of the DPD circuit 108 to compensate for or cancel signal distortion introduced by the PA circuit 104 because of its nonlinear gain compression. With both the uptilt filter circuit 106 and the DPD circuit 108, the signal at the output at 210 of the PA circuit 104 can exhibit distortion that is not reduced by the predistortion of the DPD circuit 108, and possibly even worsened by the inclusion of both the DPD circuit 108 and the uptilt filter circuit 106.

Figure 3A:
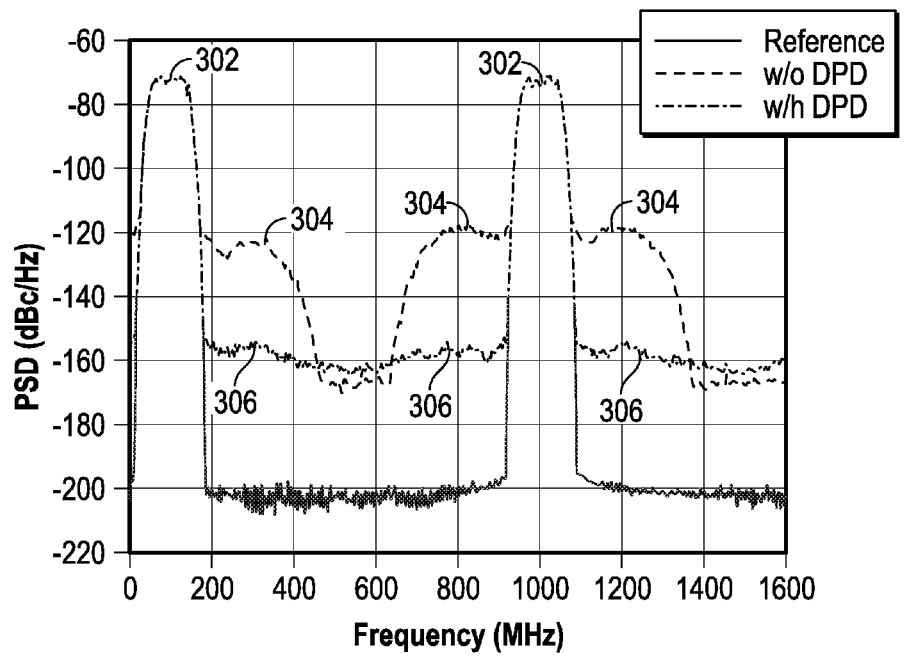
FIG. 3A shows computer simulation data for a circuit arrangement such as shown in FIG. 2, but omitting the uptilt filter circuit from the signal path.
Figure 3B:
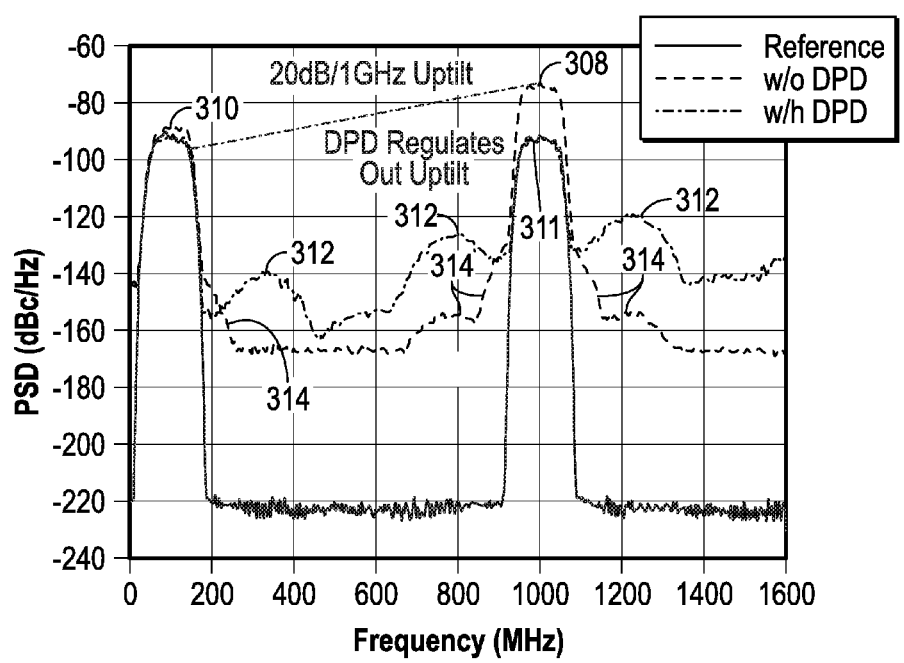
FIG. 3B shows computer simulation data for a circuit arrangement such as shown in FIG. 2, including the uptilt filter circuit (having +20 dB/GHz uptilt for frequencies above 100 MHz) in the signal path.

FIGS. 3A-3B show computer simulation data further illustrating how merely combining the DPD circuit 108 and the uptilt circuit 106, without more, can yield deleterious results. FIG. 3A shows computer simulation data for a circuit arrangement such as shown in FIG. 2, but omitting the uptilt filter circuit 106 from the signal path. The DPD circuit 108 yields signals of roughly equal amplitudes 302 at the reference frequency of 100 MHz and at the predistortion cancellation frequency of 1000 MHz. Without digital predistortion, out-of-channel sidebands 304 are present, but with digital predistortion, the out-of-channel response 306 in such sidebands is fairly flat and attenuated. FIG. 3B shows computer simulation data for a circuit arrangement such as shown in FIG. 2, including the uptilt filter circuit 106 (having +20 dB/GHz uptilt for frequencies above 100 MHz) in the signal path. At the predistortion cancellation frequency of 1000 MHz, the signal amplitude shown at 308 is higher than the signal amplitude at 310 for the reference frequency of 100 MHz—in the absence of applying digital predistortion. But when digital predistortion is applied, the signal amplitude shown at 311 at the predistortion cancellation frequency of 1000 MHz is roughly equal to the signal amplitude at 310 at the reference frequency—indicating the digital predistortion is effectively regulating out the uptilt desired for compensating the high frequency signal loss in the cable 102. Also, the out-of-channel sideband amplitudes 312 with digital predistortion are actually higher than the out-of-channel sideband amplitudes 314 without digital predistortion. Thus, FIG. 3B shows a computer simulation example in which the digital predistortion has defeated the benefit sought by including the uptilt filter circuit 106 and has actually worsened the signal distortion of the PA circuit 104 as a result of having been combined with the highpass gain expansion frequency modification of the uptilt circuit 106. These deleterious effects can further lead to instability in the system.

Figure 4:
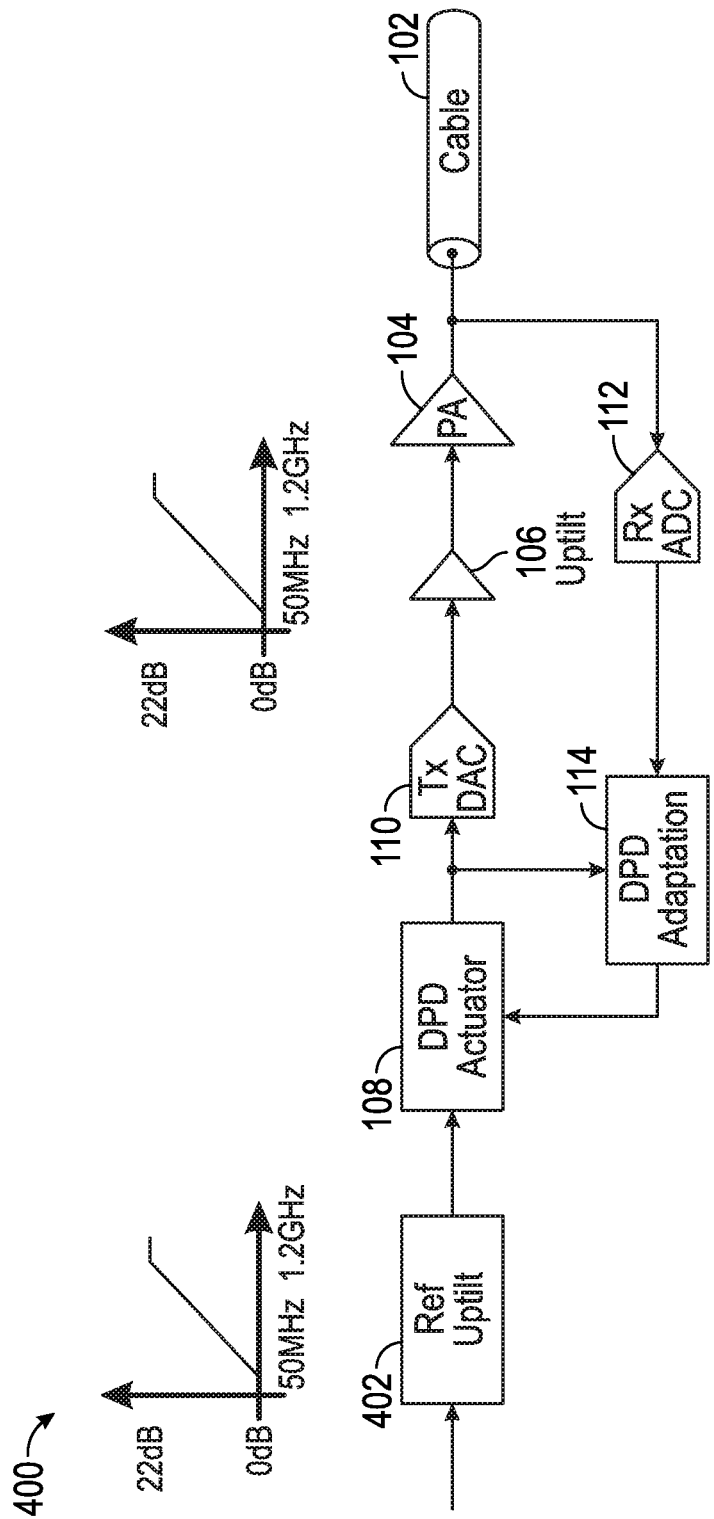
FIG. 4 shows an example of a system that can avoid a phenomenon of the digital predistortion defeating the benefit sought by including the uptilt filter circuit when these two features are used together.

FIG. 4 shows an example of a system 400 that can avoid this phenomenon of the digital predistortion defeating the benefit sought by including the uptilt filter circuit 106 when these two features are used together. The system 400 of FIG. 4 is similar to the system 100 of FIG. 1. In FIG. 4, a frequency-selective digital uptilt filter circuit 402, also referred to as a reference uptilt, has been included in the signal path before the DPD circuit 108. The digital uptilt filter circuit 402 can include a frequency response that can be specified and set to match a desired uptilt observed at the output of the PA circuit 104. Like the analog uptilt filter circuit 106, the digital uptilt filter circuit 106 can provide a highpass frequency gain expansion characteristic (e.g., +2 dB/100 MHz amplification for frequencies exceeding 50 MHz) of a cable to offset or compensate for the lowpass frequency dependent signal loss of the cable 102.

Figure 5:
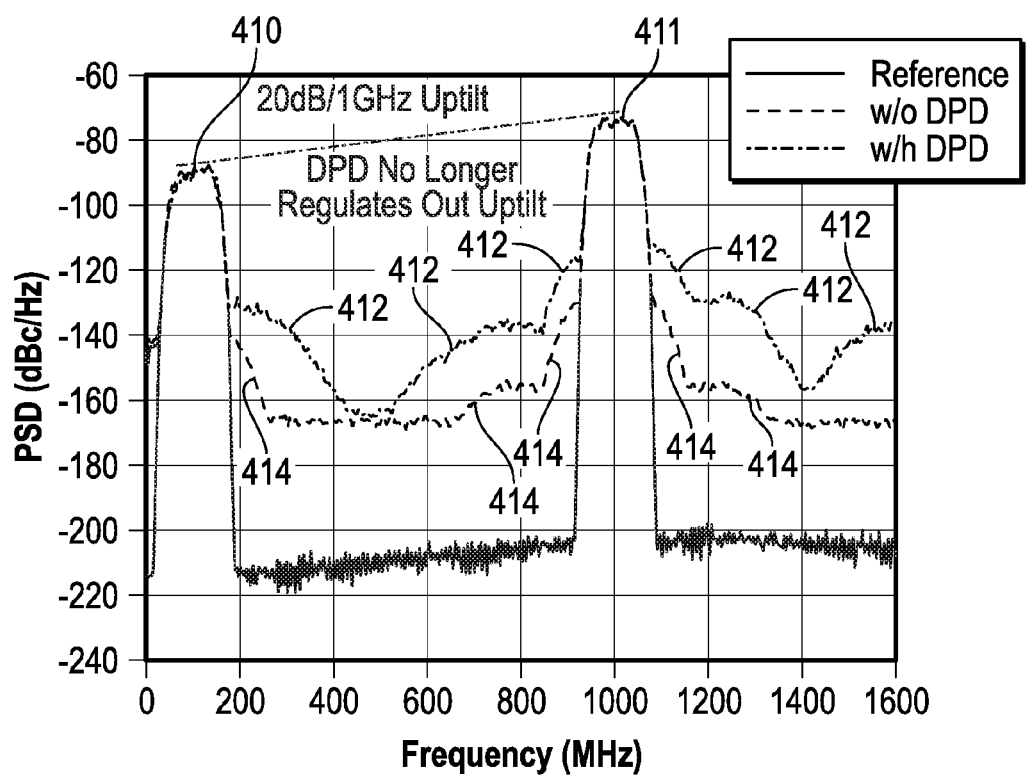
FIG. 5 shows computer simulation data for a circuit arrangement such as shown in FIG. 4—both with and without the DPD circuit providing predistortion to compensate for the nonlinear gain compression of the PA circuit.

FIG. 5 show computer simulation data further illustrating how the system 400 shown in FIG. 4 (including in the signal path both the analog uptilt circuit 106 and the digital uptilt circuit 402, each having +20 dB/GHz uptilt for frequencies above 100 MHz) can help preserve the uptilt at the output of the PA circuit 106. FIG. 5 shows computer simulation data for a circuit arrangement such as shown in FIG. 4—both with and without the DPD circuit 108 providing predistortion to compensate for the nonlinear gain compression of the PA circuit 104.

At the predistortion cancellation frequency of 1000 MHz, the signal amplitude shown at 411 is now higher than the signal amplitude at 410 for the reference frequency of 100 MHz—both with and without applying digital predistortion. This indicates that adding the digital uptilt circuit 402 into the signal path has been effective at preserving the desired uptilt at the output of the power amplifier circuit 104 for driving the cable 102, which has frequency-dependent signal loss that is approximately inverse to the provided uptilt.

But the out-of-channel sideband amplitudes 412 with digital predistortion are still actually higher than the out-of-channel sideband amplitudes 414 without digital predistortion. Thus, FIG. 5 shows a computer simulation example in which the digital predistortion provides the benefit sought by including the uptilt filter circuit 106, but still has actually worsened the signal distortion of the PA circuit 104 as a result of having been combined with the highpass gain expansion frequency modification of the uptilt circuit 106.

Figure 6:
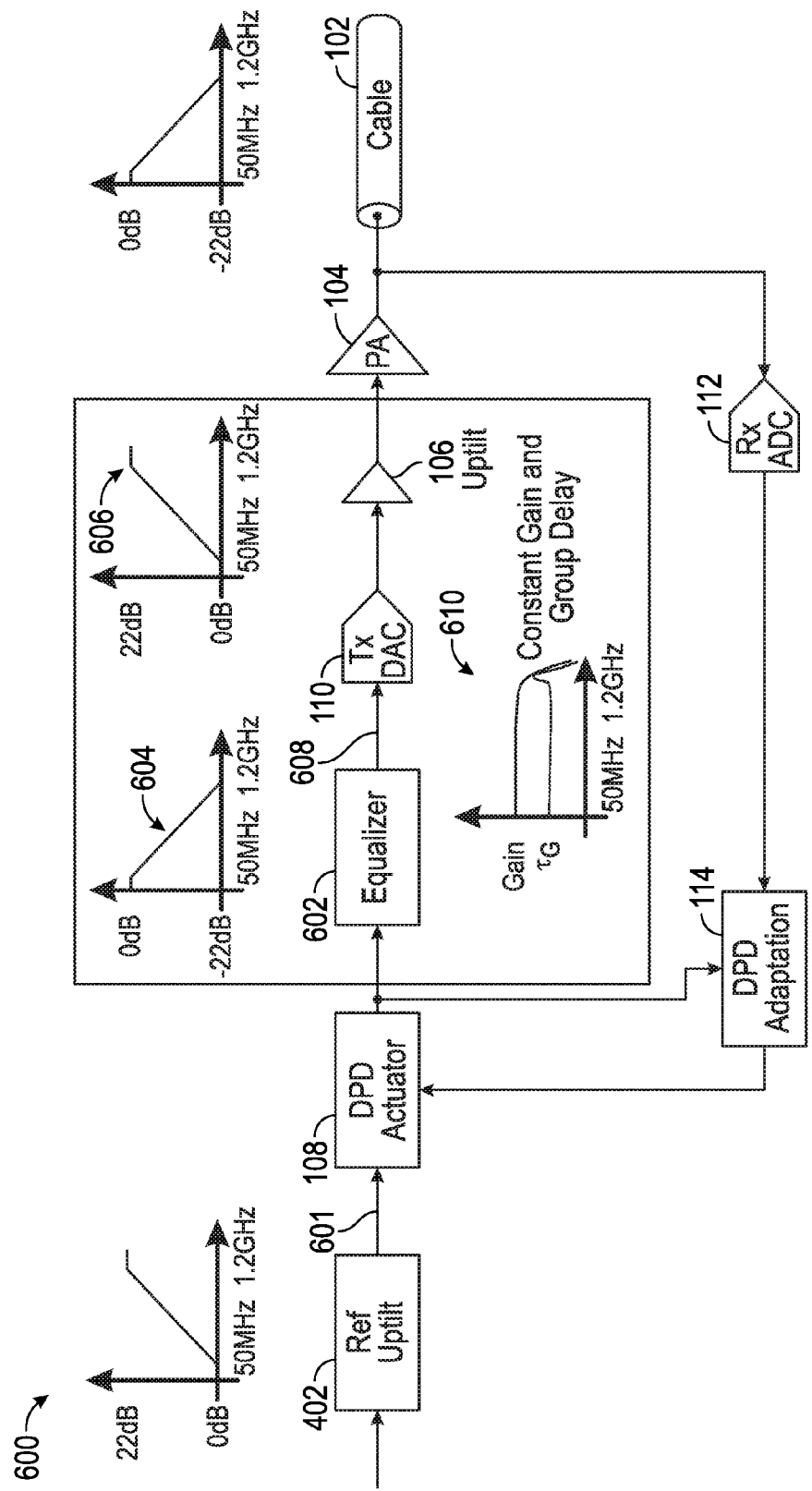
FIG. 6 shows an example of a system that can preserve the desired uptilt at the output of the PA circuit and also avoid the phenomenon of the digital predistortion actually worsening the out-of-band distortion at the output of the PA circuit when the DPD circuit and the analog uptilt circuit are used together.

FIG. 6 shows an example of a system 600 that can preserve the desired uptilt at the output of the PA circuit 104. The system 600 can also avoid the phenomenon of the digital predistortion actually worsening the out-of-band distortion at the output of the PA circuit 104 when the DPD circuit 108 and the analog uptilt circuit 106 are used together. The system 600 of FIG. 6 is similar to the system 400 of FIG. 4, except that an equalizer circuit 602 has been added in the signal path, such as between the DPD circuit 108 and the Tx DAC circuit 602. The equalizer circuit 602 can include a digital equalizer having a frequency modification setting that has a lowpass filter characteristic, such as that shown at 604, such as approximately −2.2 dB/100 MHz for frequencies above 50 MHz, which can be approximately the inverse of the frequency modification provided by the digital uptilt circuit 402 and that provided by the analog uptilt circuit 106. The particular frequency modification to be provided by the equalizer circuit 602 can be selected to compensate for or eliminate the effect of the analog uptilt circuit 606 interposing a frequency dependent uptilt gain and group delay variation between the DPD circuit 108 and the power amplifier circuit 104. The particular frequency modification to be provided by the equalizer circuit 602 can be selected to provide a substantially constant gain vs. frequency, a substantially constant group delay vs. frequency, or both, such as at the output of the equalizer circuit 602 at 608, such as shown conceptually at 610 in FIG. 6. Thus, the equalizer circuit 602 can be used to obtain a constant gain response and group delay, across a frequency band of interest, between the output of the DPD circuit 108 and the input of the PA circuit 104. To help ensure that the PA circuit 106 preserves the uptilt correction provided by the analog uptilt filter circuit 106, the signal provided to the input of the DPD circuit 108 can be shaped by a digital representation of the uptilt of the analog uptilt filter circuit 106, and such digital representation of the uptilt can be applied to the input of the DPC circuit 108 using the digital uptilt circuit 402.

Figure 7:
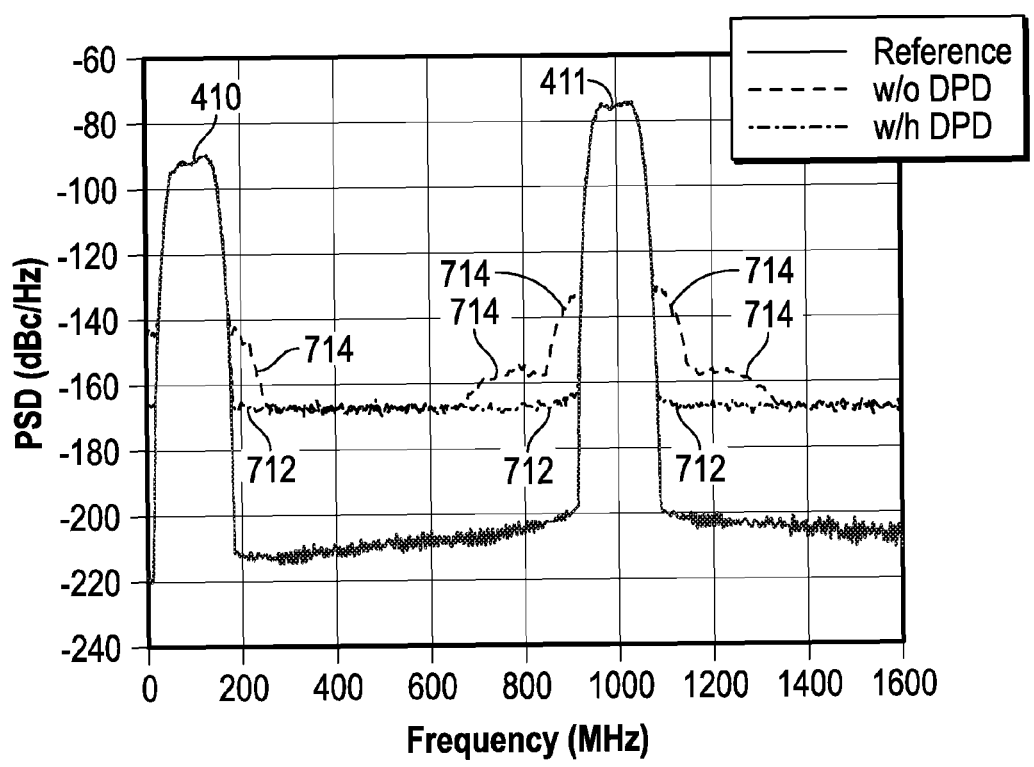
FIG. 7 shows computer simulation data further illustrating how the system shown in FIG. 6 can help preserve the uptilt at the output of the PA circuit without resulting in deleterious distortion such as was shown in FIG. 5 for the system in FIG. 4, which did not include the equalizer circuit. Thus, FIG. 7 can be compared with FIG. 5 to show the effect of including the equalizer circuit (with simulation results such as shown in FIG. 7) as opposed to omitting the equalizer circuit 602 (with simulation results as shown in FIG. 5).

FIG. 7 shows computer simulation data further illustrating how the system 600 shown in FIG. 6 (including in the signal path both the analog uptilt circuit 106 and the digital uptilt circuit 402, each having +20 dB/GHz uptilt for frequencies above 100 MHz, and the equalizer circuit 602) can help preserve the uptilt at the output of the PA circuit 106 without resulting in deleterious distortion such as was shown in FIG. 5 for the system 400, which did not include the equalizer circuit 602. Thus, FIG. 7 can be compared with FIG. 5 to show the effect of including the equalizer circuit 602 (with simulation results such as shown in FIG. 7) as opposed to omitting the equalizer circuit 602 (with simulation results as shown in FIG. 5). FIG. 7 shows computer simulation data for a circuit arrangement such as shown in FIG. 6—both with and without the DPD circuit 108 providing predistortion to compensate for the nonlinear gain compression of the PA circuit 104.

At the predistortion cancellation frequency of 1000 MHz, the signal amplitude shown at 411 is still higher than the signal amplitude at 410 for the reference frequency of 100 MHz-both with and without applying digital predistortion, as was the case with the simulation results shown in FIG. 5. This indicates that adding the digital uptilt circuit 402 into the signal path remains effective at preserving the desired uptilt at the output of the power amplifier circuit 104 for driving the cable 102, which has frequency-dependent signal loss that is approximately inverse to the provided uptilt.

But in FIG. 7 the out-of-channel sideband amplitudes 712 with digital predistortion are now much less than the out-of-channel sideband amplitudes 714 without digital predistortion. Thus, FIG. 7 shows a computer simulation example in which the digital predistortion provides the benefit sought by including the uptilt filter circuit 106, while also providing the benefit of reduced signal distortion at the output of the PA circuit 104 because of the digital predistortion properly compensating for the nonlinear gain compression of the PA circuit 104.

Figure 8:
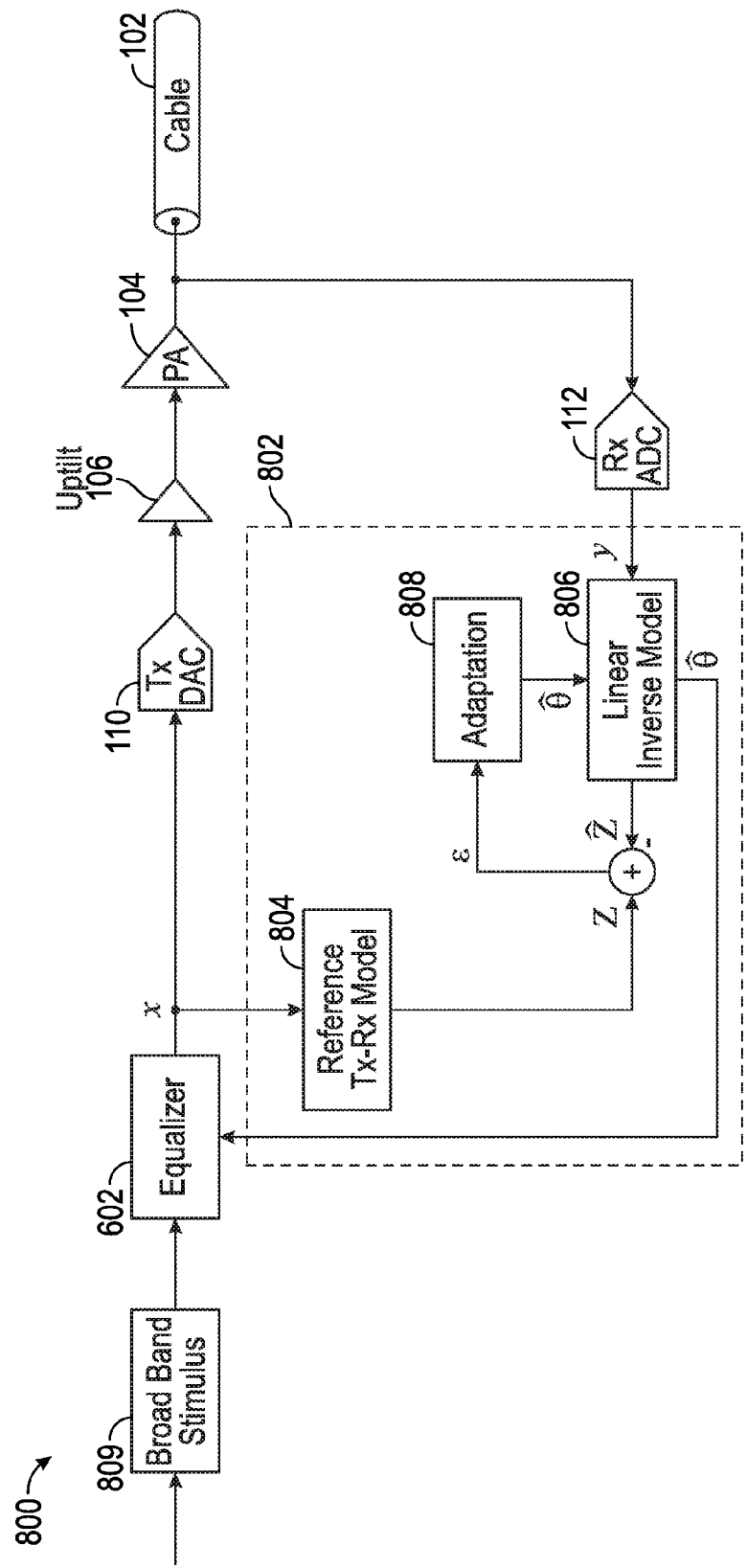
FIG. 8 shows an example of a system for training the equalizer circuit.

FIG. 8 shows an example of an system 800 for training the equalizer circuit 602, such as in a training mode, such that it can properly apply its frequency modification such as when in a separate or different operating mode. A digital equalizer training circuit 802 can be included. The equalizer training circuit 802 can receive as an input, from the Rx ADC circuit 112, a digital representation of the signal being monitored at the output of the PA circuit 104. The equalizer training circuit 802 can also receive as an input, from the output of the equalizer circuit 602, a sample of the output signal being provided at the node 608 by the output of the equalizer circuit 602. The equalizer training circuit 802 can provide an output signal, such as to the equalizer circuit 602, indicating the particular frequency modification to be applied by the equalizer circuit 602.

The equalizer training circuit 802 can include a reference Tx-Rx Model 804 and a Linear Inverse Model 806, such as can be stored in a memory circuit such as within the equalizer training circuit or elsewhere. The equalizer training circuit 602 can also include an Adaptation circuit 808. The Linear Inverse Model 806 can include an inverse model of the transfer function of the forward signal path from the input of the Tx DAC circuit 110, through the analog uptilt filter circuit 106, through the PA circuit 104, and through the Rx ADC circuit 112, to the output of the Rx ADC circuit 112. The reference Tx-Rx Model 804 can provide a model of a desired transfer function around the loop, such as from an input of the DAC circuit 110 to the output of the ADC circuit 112. In an example, the desired transfer function through the system can include a flat gain, a linear phase response, and a constant group delay over the frequency band of interest. For example, for a cable television network communications example, the desired transfer function through the system can include providing a flat gain response (e.g., without ripple) up to 1.2 GHz with a first order finite impulse response (FIR) filter response rolloff for frequencies above 1.2 GHz.

During the equalizer training mode, the PA circuit 104 can be configured to operate at a power level that keeps the PA circuit 104 within a linear gain region, e.g., such that a gain compression factor falls below a specified threshold value, or power level decreased by a specified amount (e.g., 10 dB) below a present power level or a specified maximum power level, or such that a distortion characteristic is less than a noise floor threshold value. In this way, the training loop arrangement of the system 800 shown in FIG. 8 can be running linearly with negligible distortion being introduced by the PA circuit 108.

In this training mode, a broadband training stimulus input signal 809 can be provided at an input to the equalizer circuit 602, and a resulting signal output by the PA circuit 104 can be monitored. This can include digitizing the monitored signal, such as using the Rx ADC circuit 112, and applying the digitized signal to the Linear Inverse Model 806.

In the training mode, the Adaptation circuit 808 can apply a least-squares fit or similar approach to generate or modify the Linear Inverse Model 806 to provide the desired frequency modification of the digital equalizer circuit 602, which can be implemented as an FIR filter response in the digital equalizer circuit 602. The signal, x, output by the equalizer circuit 602 can be used as an input that can be applied to the reference Tx-Rx Model 804, such as to produce a resulting signal z1. The output of the PA circuit 108 can be digitized and provided as an input to the Linear Inverse Model 806, such as to produce a resulting signal z2. A difference between these two resulting signals z1 and z2 can be minimized by the Adaptation circuit 808, such as by applying the least-squares fit or similar approach to generate or modify the Linear Inverse Model 806 in such a manner so as to minimize the difference between the resulting signals z1 and z2. The resulting generated or modified Linear Inverse Model 806 can be used to set the frequency modification characteristics of the equalizer circuit 602. The particular equalizer circuit 602, and the particular equalizer training circuit 802 are merely illustrative. Other approaches can be used to provide an equalizer to equalize out or otherwise compensate for the analog uptilt, and to train such an equalizer.

The training mode of the equalizer can be invoked initially at power-up, e.g., as a calibration, before the system 600 is placed into an operating mode to perform its cable television network or other communications function. The training mode can be invoked recurrently, such as infrequently, e.g., hourly, daily, weekly, monthly, etc., if desired, such as to account for drift in one or more system characteristics during operation. In an example, the equalizer training mode can be triggered and invoked in response to a monitored determination that one or more system characteristics have drifted enough to impact accuracy of the digital predistortion being provided by the DPC circuit 108. Laboratory experimental characterization can additionally or alternatively be used, which can obviate the need for (or augment) on-line adaptation, if desired. The analog uptilt can have well-defined and temporally stable behavior, thereby allowing a single laboratory characterization of Linear Inverse Model 806 to suffice.

Figure 9:
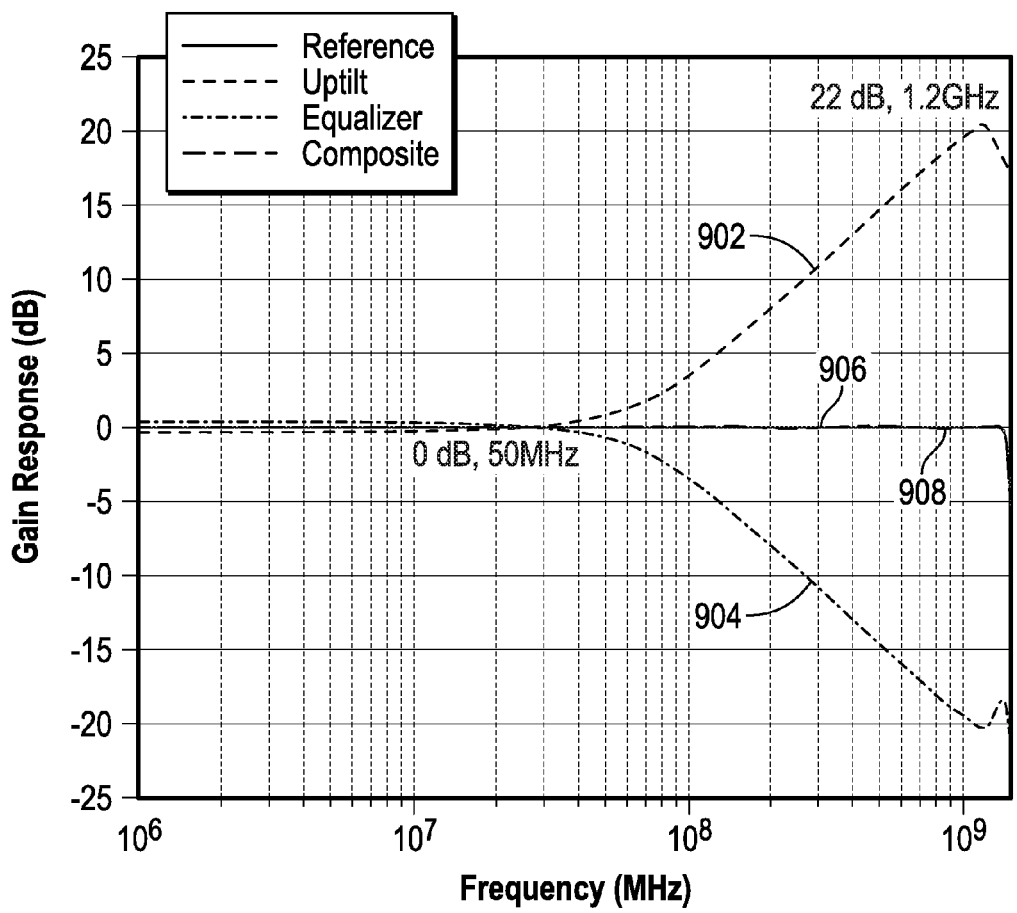
FIG. 9 shows computer simulation data of gain response (dB) vs. frequency (Hz) further illustrating how the system shown in FIG. 6 can operate using training of the equalizer circuit in the equalizer training mode.

FIG. 9 shows computer simulation data of gain response (dB) vs. frequency (Hz) further illustrating how the system 600 shown in FIG. 6 can operate using training of the equalizer circuit 602 in the equalizer training mode. The uptilt gain response 902 of the uptilt circuit 106 (e.g., slope +2 dB/100 MHz for frequencies above 100 MHz) is shown in FIG. 9 as being approximately the inverse of the equalizer gain response 904 (e.g., slope −2 dB/100 MHz for frequencies above 100 MHz) of the equalizer circuit 602. The Rx-Tx reference gain response 906 represents a desired loop response (e.g., $1^{st}$ order flat gain rolloff and linear phase for frequencies exceeding 1.2 GHz implemented digitally as an FIR filter such as using the equalizer circuit 602). A resulting composite loop gain response 908 of the system 600, after equalizer training, is approximately equal to the desired loop reference gain response 906.

Figure 10:
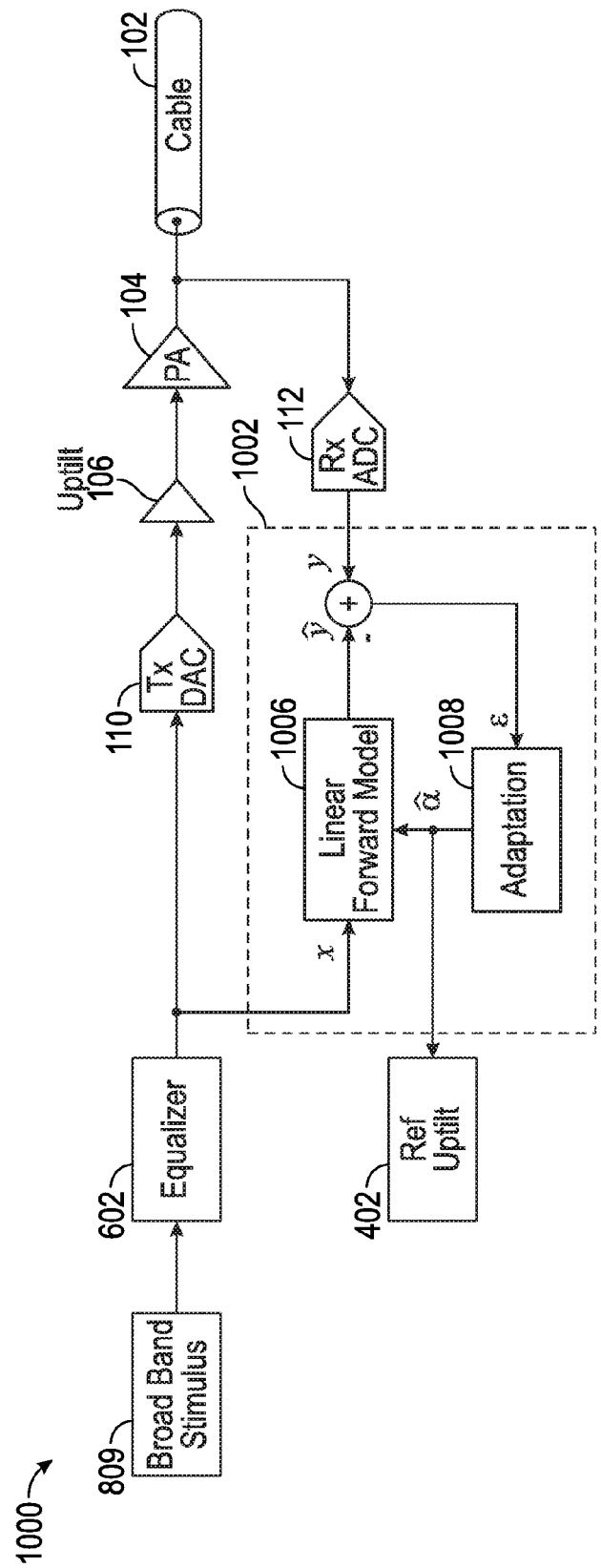
FIG. 10 shows an example of a system for training the digital "reference" uptilt filter circuit, such as in a training mode.

FIG. 10 shows an example of a system 1000 for training the digital "reference" uptilt filter circuit 402, such as in a training mode, such that it can properly apply its frequency modification such as when in a separate or different operating mode. A digital reference uptilt filter training circuit 1002 can be included. The digital reference uptilt filter training circuit 1002 can receive as an input, from the Rx ADC circuit 112, a digital representation of the signal being monitored at the output of the PA circuit 104. The digital reference uptilt filter training circuit 1002 can also receive as an input, from the output of the equalizer circuit 602, a sample of the output signal being provided at the node 608 by the output of the equalizer circuit 602. The digital reference uptilt filter training circuit 1002 can provide an output signal, such as to the digital reference uptilt circuit 402, indicating the particular frequency modification to be applied by the digital reference uptilt circuit 402.

The digital reference uptilt filter training circuit 1002 can include a Linear Forward Model 1006, such as can be stored in a memory circuit such as within the digital reference uptilt filter training circuit 1002 or elsewhere. The digital reference uptilt filter training circuit 1002 can also include an Adaptation circuit 1008. The Linear Forward Model 1006 can include a forward model of the transfer function of the forward signal path from the input of the Tx DAC circuit 110, through the analog uptilt filter circuit 106, through the PA circuit 104, and through the Rx ADC circuit 112, to the output of the Rx ADC circuit 112.

During the digital reference uptilt filter training mode, the PA circuit 104 can be configured to operate at a power level that keeps the PA circuit 104 within a linear gain region, e.g., such that a gain compression factor falls below a specified threshold value, or power level decreased by a specified amount (e.g., 10 dB) below a present power level or a specified maximum power level, or such that a distortion characteristic is less than a noise floor threshold value. In this way, the training loop arrangement of the system 1000 shown in FIG. 10 can be running linearly with negligible distortion being introduced by the PA circuit 108.

In this training mode, a broadband training stimulus input signal 809 can be provided at an input to the equalizer circuit 604, and a resulting signal output by the PA circuit 104 can be monitored. This can include digitizing the monitored signal, such as using the Rx ADC circuit 112, and applying the digitized signal to the Linear Forward Model 1006.

In the training mode, the Adaptation circuit 1008 can apply a least-squares fit or similar approach to generate or modify the Linear Forward Model 1006 to provide the desired frequency modification of the digital reference uptilt filter circuit 402. The signal, x, output by the equalizer circuit 602 can be used as an input that can be applied to the Linear Forward Model 1006, such as to produce a resulting signal z1. The output of the PA circuit 108 can be digitized and provided as to produce a resulting signal z2. A difference between these two resulting signals z1 and z2 can be minimized by the Adaptation circuit 1008, such as by applying the least-squares fit or similar approach to generate or modify the Linear Forward Model 1006 in such a manner so as to minimize the difference between the resulting signals z1 and z2. The resulting generated or modified Linear Inverse Model 806 can be used to set the frequency modification characteristics of the digital reference uptilt filter circuit 402.

The training mode of the digital reference uptilt filter circuit 402 can be invoked initially at power-up, e.g., as a calibration, before the system 600 is placed into an operating mode to perform its cable television network or other communications function, such as during or after the equalizer training mode. The training mode of the digital reference uptilt filter circuit 402 can be invoked recurrently, such as infrequently, e.g., hourly, daily, weekly, monthly, etc., if desired, such as to account for drift in one or more system characteristics during operation, such as triggering such training to occur during or after the equalizer training mode. In an example, the digital reference uptilt filter circuit 402 training mode can be triggered and invoked in response to a monitored determination that one or more system characteristics have drifted enough to impact accuracy of the digital predistortion being provided by the DPC circuit 108.

Since the equalizer training uses a Linear Reverse Model 806 between the same system nodes as the Linear Forward Model 1006 used for the digital reference uptilt filter circuit 402 training mode, the same code can conveniently be used for performing both the forward and reverse modeling functions. Laboratory experimental characterization can additionally or alternatively be used, which can obviate the need for (or augment) on-line adaptation, if desired.

Figure 11:
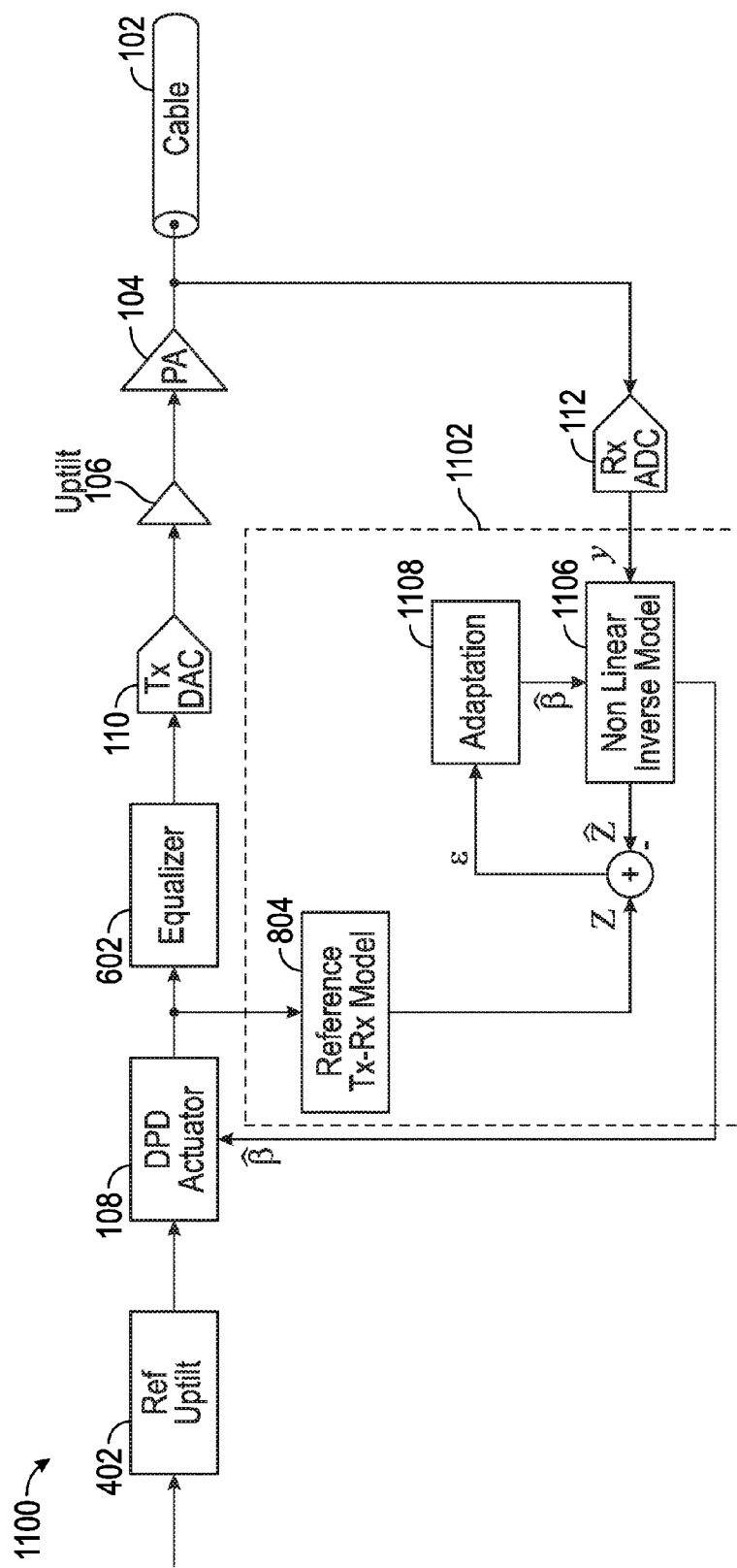
FIG. 11 shows an example of a system for training or adapting the DPD circuit, such as in a training mode.

FIG. 11 shows an example of a system 1100 for training or adapting the DPD circuit 108, such as in a training mode, such that it can properly apply its nonlinear predistortion, such as when in a separate or different operating mode. A DPD training circuit 1102 can be included. The DPD training circuit 1102 can receive as an input, from the Rx ADC circuit 112, a digital representation of the signal being monitored at the output of the PA circuit 104. The DPD training circuit 1102 can also receive as an input, from the output of the DPD circuit 108, a sample of the output signal being provided by the output of the DPD circuit 108, which can be provided to the reference Tx-Tx Model 804 that can be included in the DPD training circuit 1102. The DPD training circuit 1102 can provide an output signal, such as to the DPD circuit 108, indicating the particular predistortion to be applied by the DPD circuit 108. There can be numerous ways to train the DPD circuit 108.

For example, the DPD training circuit 1102 can include a Non-Linear Inverse Model 1106, such as can be stored in a memory circuit such as within the DPD training circuit 1002 or elsewhere. The DPD training circuit 1102 can also include an Adaptation circuit 1108. The Non-Linear Inverse Model 1106 can include an inverse model of the transfer function from the input of the DAC circuit 110 to the output of the Rx ADC circuit 112.

During the DPD circuit 108 training mode, the PA circuit 104 can be allowed to operate at a power level that allows the PA circuit 104 to operate in a non-linear gain region, e.g., such that a gain compression factor exceeds a specified threshold value, or power level exceeds a specified amount, or such that a distortion characteristic (without applying digital predistortion) exceeds a threshold value. In this way, the training loop arrangement of the system 1100 shown in FIG. 11 can be running non-linearly with distortion being introduced by the PA circuit 104, and non-linear predistortion being introduced by the DPD circuit 108.

In this adaptive or training mode, a broadband training stimulus input signal 809 can be provided at an input to the digital reference uptilt filter circuit 402, and a resulting signal output by the PA circuit 104 can be monitored. This can include digitizing the monitored signal, such as using the Rx ADC circuit 112, and applying the digitized signal to the Non-Linear Inverse Model 1106.

In the DPD circuit 108 training mode, the Adaptation circuit 1108 can apply a least-squares fit or similar approach to generate or modify the Non-Linear Inverse Model 1106 to provide the desired nonlinear predistortion of the DPD circuit 108. The signal, x, output by the DPD circuit 108 can be used as an input that can be applied to the reference Tx-Rx Model 804, such as to produce a resulting signal z1. The output of the PA circuit 108 can be digitized and the Non-Linear Inverse Model 1106 applied thereto to produce a resulting signal z2. A difference between these two resulting signals z1 and z2 can be minimized by the Adaptation circuit 1108, such as by applying the least-squares fit or similar approach to generate or modify the Non-Linear Inverse Model 1106 in such a manner so as to minimize the difference between the resulting signals z1 and z2. The resulting generated or modified Non-Linear Inverse Model 1106 can be used to set the non-linear predistortion characteristics of the DPD circuit 108.

The adaptation or training mode of the DPD circuit 108 can be invoked initially at power-up, e.g., as a calibration, before the system 600 is placed into an operating mode to perform its cable television network or other communications function, such as after the equalizer circuit 602 training mode and the reference uptilt circuit 402 training modes have been completed. The DPD circuit 108 training mode can be invoked recurrently, such as at a low duty cycle but more frequently than the equalizer circuit 602 training mode or the reference uptilt circuit 402 training mode, e.g., once per minute, once per 100 milliseconds, etc., if desired, such as to account for drift in one or more system characteristics during operation. In an example, the DPD filter circuit 108 training mode can be triggered and invoked in response to a monitored determination that one or more system characteristics have drifted enough to impact accuracy of the digital predistortion being provided by the DPC circuit 108.

Figures 1, 12:
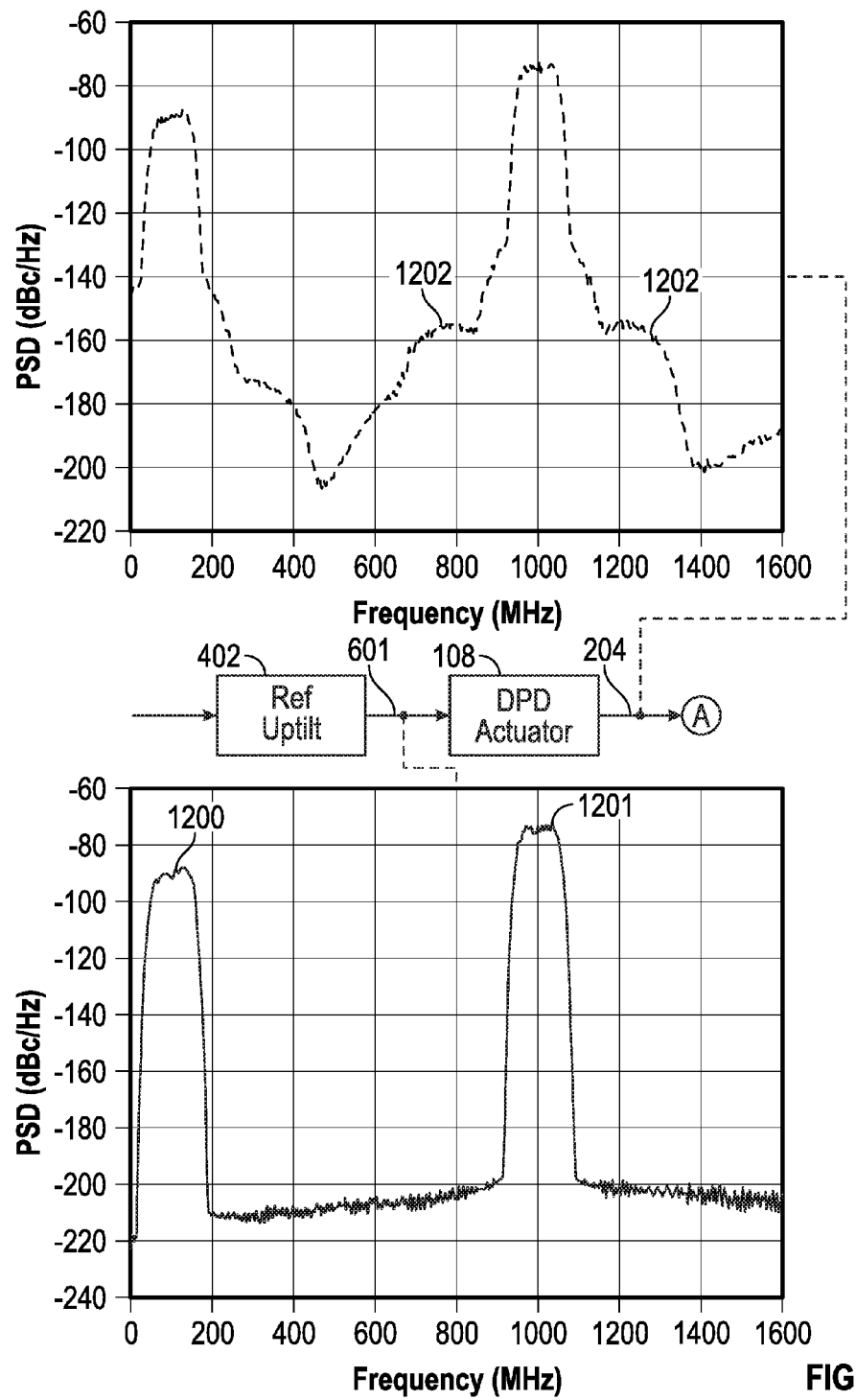
Figures 2, 12:
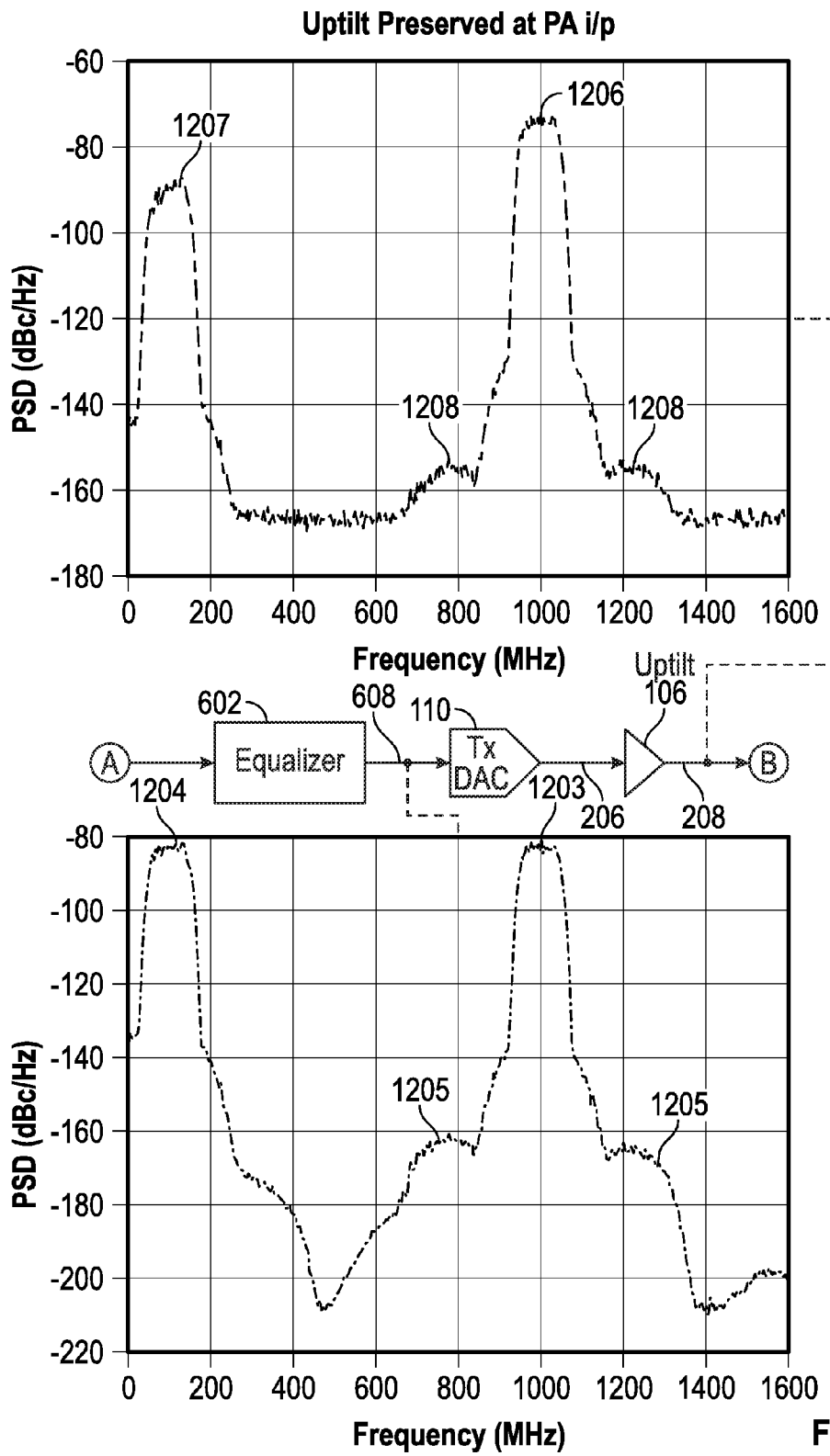
Figures 3, 12:
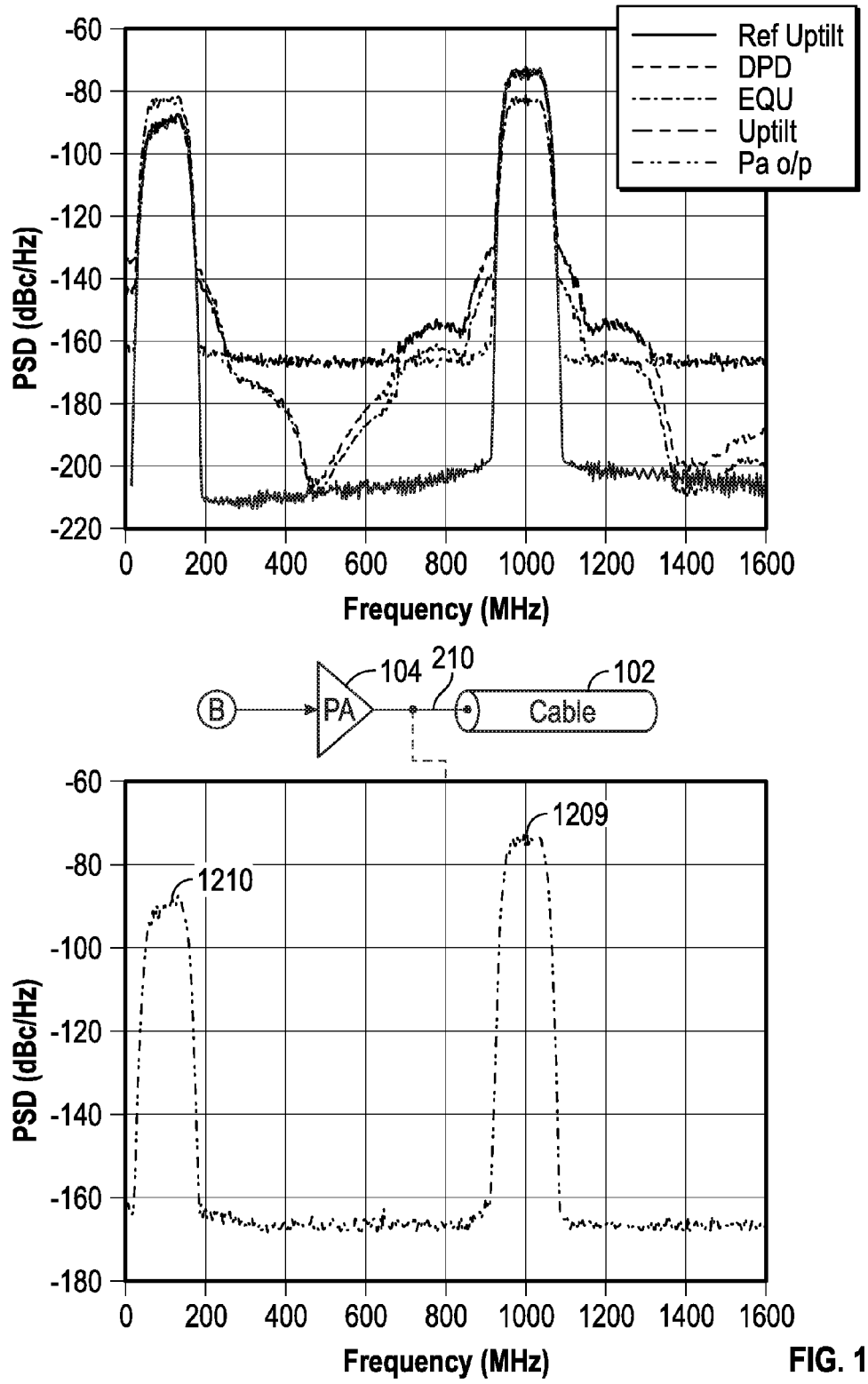

FIGS. 12-1, 12-2, and 12-3 show computer simulation data of power spectral density (dBc/Hz) vs. frequency, graphed at various nodes of the system 600 (after completion of the various training modes), such as at node 601 at the output of the digital reference uptilt filter circuit 402, at node 204 at the output of the DPD circuit 108, at node 608 at the output of the equalizer circuit 602, at node 206 at the output of the Tx DAC circuit 110, at node 208 at the output of the analog uptilt filter circuit 106, and at node 210 at the output of the PA circuit 104, along with a composite of such signals overlaid each other (top right-hand graph of FIG. 12). FIG. 12 shows, at node 601, the reference uptilt at 1201 (at 1000 MHz) having a higher spectral amplitude relative to that at 1200 (at 100 MHz). At node 204, at the output of the DPD circuit, corrective components 1202 produced by the DPD circuit 108. At node 608, at the output of the equalizer circuit 602, the uptilt is absent, as seen by the substantially equal spectral amplitudes at 1203 (at 1000 MHz) at 1204 (at 100 MHz), together with the corrective components 1205 as seen at node 608. At node 208, at the output of the analog uptilt filter circuit 106, the uptilt is observed, as can be seen by the higher spectral amplitude at 1206 (at 1000 MHz) than that 1207 (at 100 MHz), together with the corrective components 1208 as seen at 208. At node 210, at the output of the PA circuit 104, the uptilt is observed, as can be seen by the higher spectral amplitude at 1209 (at 1000 MHz) than at 1210 (at 100 MHz), without any remaining sideband distortion components.

Using this approach, the dynamic range and hence SNR at the Tx DAC circuit 110 is preserved, regardless of whether uptilt is present. The absence of the uptilt effect at node 608, at the input of the Tx DAC circuit 110, can be helpful, particularly when the SNR of the Tx DAC circuit 110 is not large enough to ensure that the lower frequency channels would be converted with enough accuracy if there was of the order of −20 dB attenuation (e.g., the tilt effect) present. Having zero or negligible tilt effect at node 608 at the input of the Tx DAC circuit 110 can therefore be very advantageous to use of the system in a cable television network communications or other communications application. Thus, it can be advantageous when the signal at the equalizer output or Tx DAC circuit 110 input has a signal dynamic range equivalent to that as if there was no tilt. Otherwise the SNR of the signal through the Tx DAC circuit 110 could be compromised. An approach to combining digital pre-distortion and uptilt that didn't preserve this dynamic range would likely suffer dynamic range problems.

Figure 13:
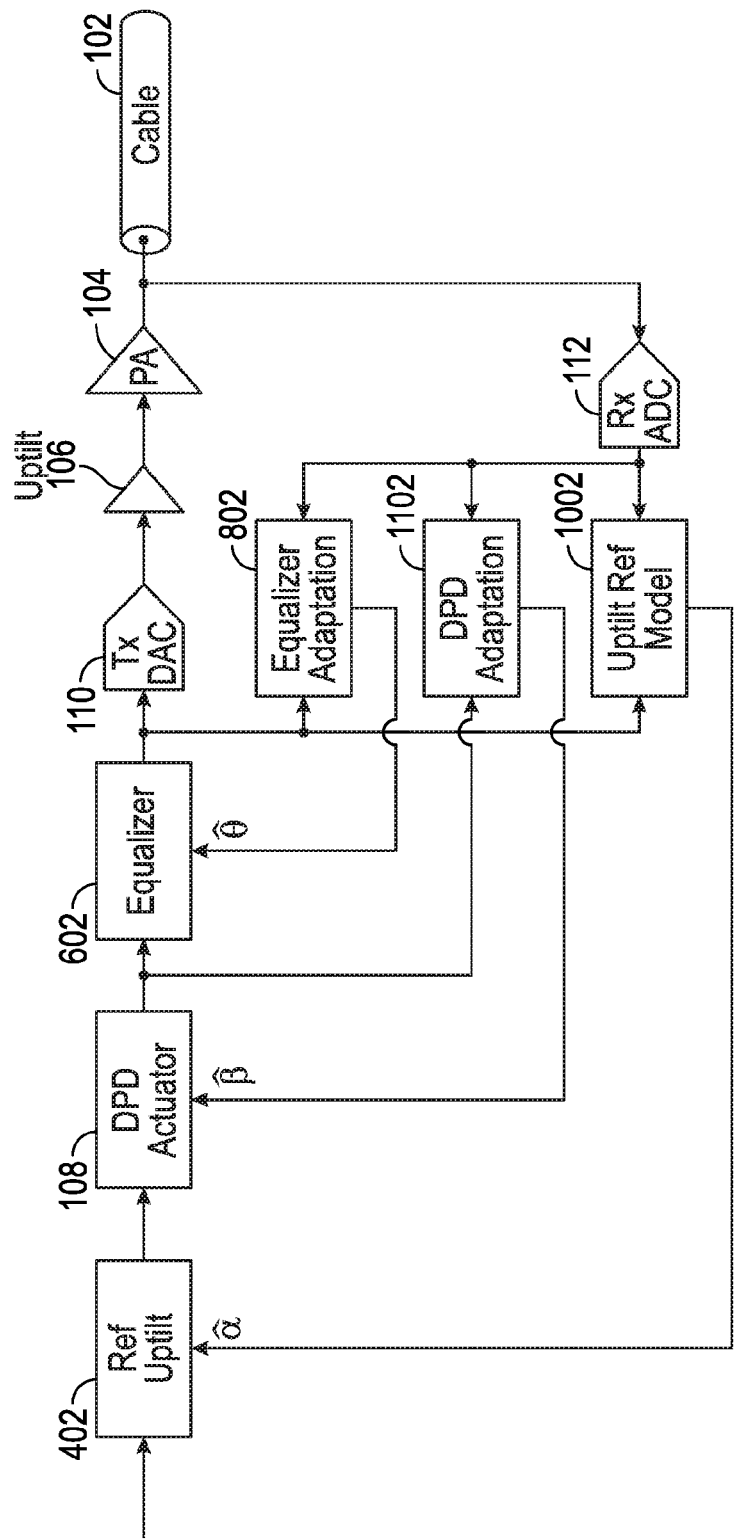
FIG. 13 is an example of the system, together with various training/adaptation components (e.g., an equalizer training circuit, a DPD training circuit, and a digital reference uptilt filter training circuit), such as can be included in respective feedback loops for performing their training, adaptation, or modeling functions, such as individually, or in combination.

FIG. 13 is an example of the system 600, together with the various training/adaptation components (e.g., equalizer training circuit 802, DPD training circuit 1102, and digital reference uptilt filter training circuit 1002) included in respective feedback loops for performing their training, adaptation, or modeling functions, such as individually, or in combination. As explained herein, the equalizer training circuit 802 can include a Reverse Linear Model of the system from the input of the Tx DAC circuit 110 to the output of the Rx ADC circuit 112, with training that can be performed at a reduced power level such that the PA operates at a gain that is well within its linear range. The DPD training circuit 1102 can include a Reverse Non-Linear Model from the output of the Equalizer circuit 602, trained to match a reference Tx-Rx Model 804, with the PA circuit 104 allowed to operate in its non-linear gain region. The digital reference uptilt filter circuit training circuit 1002 can include a Forward Linear model from the input of the Tx DAC circuit 110 to the output of the Rx ADC circuit 112, with training that can be performed at a reduced power level such that the PA operates at a gain that is well within its linear range.

Figure 14:
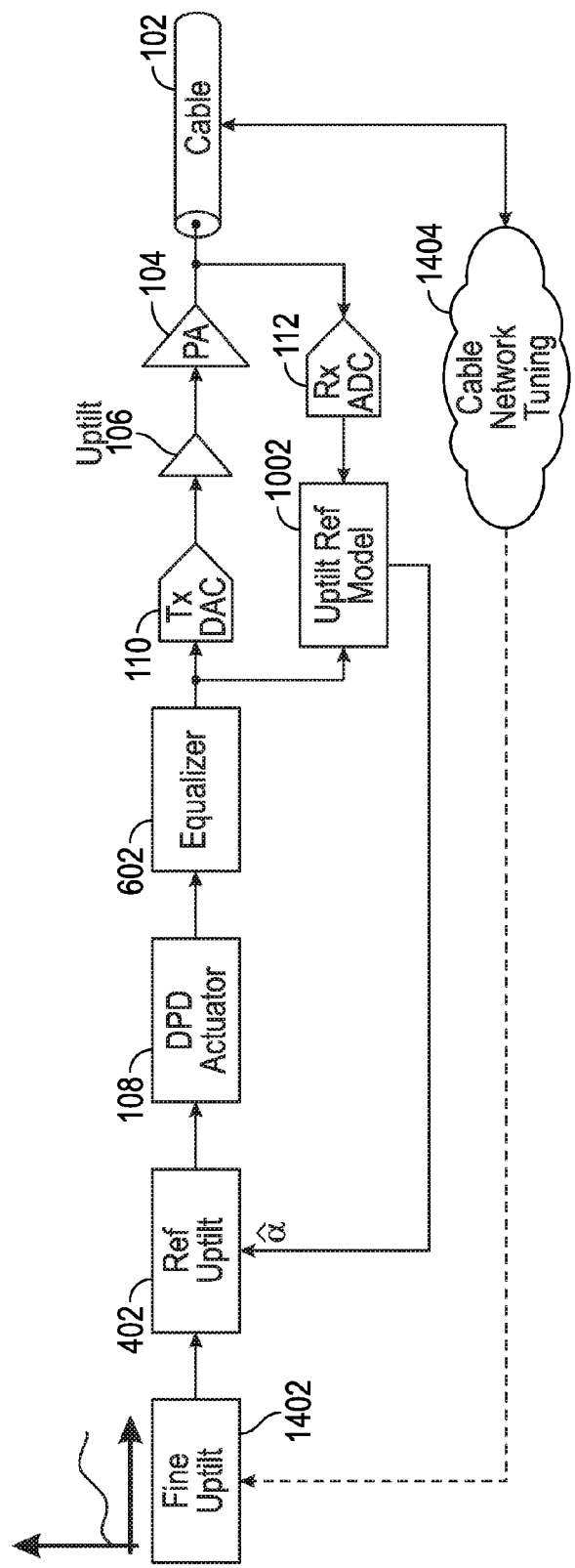
FIG. 14 shows a further example of a system, which is like the system of FIG. 6, but in which a further digital "fine" uptilt filter circuit has been included, such as in addition to the reference digital uptilt circuit already described herein, and in addition to the "coarse" uptilt that can be provided by an analog uptilt filter circuit.

FIG. 14 shows a further example of a system 1400, which is like the system 600 of FIG. 6, but in which a further digital uptilt filter circuit 1402 has been included, in addition to the reference digital uptilt circuit 402 already described herein. For example, the reference digital uptilt circuit 402 can be implemented to provide a frequency modification like that of the analog uptilt circuit 106, which, in turn, can be specified to compensate for the general frequency-dependent signal loss characteristics of the cable 102 likely to be used in the cable television communication network. However, upon or after actual deployment of the system 1400 to drive a particular cable 102 in the cable television communication network, further characteristics of the particular cable 102 can be compensated for, such as using the additional uptilt that can be provided by the further digital uptilt filter circuit 1402. In this way, the analog uptilt circuit 106 can provide a coarse tilt to compensate for the frequency-dependent signal loss expected from a generalized cable 102, and the added further digital uptilt filter circuit 1402 can provide a fine tilt to further compensate for the particular frequency-dependent signal loss yielded by the particular cable 102 to which the system 1400 is connected. A cable network tuning channel 1404 can be used to provide the information by which the fine uptilt circuit 1402 is adjusted, such as based upon cable diagnostic equipment that can be used by a cable technician during commissioning of the system 1400.

Such fine tuning of uptilt and inclusion of the further digital uptilt filter circuit 1402 is optional, and may involve using information about whether there is sufficient digital headroom in the signal (e.g., within the dynamic range of the Tx DAC circuit 110) to accommodate any additional signal expansion by the digital uptilt filter circuit 1402.

The present techniques can be used in combination with one or more techniques described in U.S. Provisional Patent Application No. 62/240,706, filed on Oct. 13, 2015, entitled ULTRA WIDE BAND DIGITAL PRE-DISTORTION, which is incorporated herein by reference in its entirety, including for its description of a wide band model of a power amplifier, compressed sensing such as to reduce the number of basis terms in the wide band model, and sparse equalization that can be added to improve the stability of the digital pre-distortion.

VARIOUS NOTES & EXAMPLES

Example 1 can include or use subject matter (such as an apparatus, a method, a means for performing acts, or a device readable medium including instructions that, when performed by the device, can cause the device to perform acts), such as can include a system configured to drive a cable communications load having a lowpass frequency response. The system can include a frequency-selective analog uptilt circuit, including an analog uptilt circuit input to receive a digitally pre-distorted signal, a highpass frequency response selected to compensate for the lowpass frequency response of the cable communications load, and an analog uptilt circuit output configured to be coupled to the cable communications load. The system can also include a digital-predistortion (DPD) circuit, including a DPD input and including a DPD output coupled to the analog uptilt circuit input, the DPD circuit configured to apply a nonlinear digital predistortion to an input signal received at the DPD input to provide, at the DPD output, the digitally pre-distorted signal to the analog uptilt circuit input.

Example 2 can include or use, or can optionally be combined with the subject matter of Example 1 to optionally include or use a system comprising a digital-to-analog converter (DAC) circuit, including a digital DAC input coupled to the DPD output and an analog DAC output coupled to the analog uptilt circuit input. The system can include a power amplifier (PA) circuit, including a PA input coupled to the analog uptilt circuit output, and a PA output configured to drive the cable communications load, the PA circuit including a nonlinear gain compression as a PA circuit output power level increases.

Example 3 can include or use, or can optionally be combined with the subject matter of one or any combination of Examples 1-2, to optionally include or use a dynamic range at the DAC input that is maintained at a level that is equivalent to a dynamic range present without uptilt in the system.

Example 4 can include or use, or can optionally be combined with the subject matter of one or any combination of Examples 1-3, to optionally include or use a frequency-selective digital uptilt circuit, including a digital uptilt input to receive a digital input signal, the digital uptilt circuit having a highpass frequency response selected to emulate a highpass frequency response of the analog uptilt circuit, and having a digital uptilt output coupled to the DPD input. A frequency selective equalizer circuit can be included, including an equalizer input coupled to the DPD output, a lowpass frequency response selected to compensate for the highpass frequency response of the digital uptilt circuit, and an equalizer output coupled to the analog uptilt circuit input.

Example 5 can include or use, or can optionally be combined with the subject matter of one or any combination of Examples 1-4, to optionally include or use the equalizer circuit including a training mode in which the lowpass frequency response of the equalizer circuit can be selected to compensate for the highpass frequency response of the digital uptilt circuit including by applying a reference Tx-Rx model of a desired system response to a signal output from the equalizer circuit to produce a resulting signal $z_1$.

Example 6 can include or use, or can optionally be combined with the subject matter of one or any combination of Examples 1-5, to optionally include or use an analog-to-digital converter (ADC) circuit such as can include an ADC input coupled to the PA output, and can include an ADC output. A linear inverse model can be included, such as can be stored in a memory, such as can include an input coupled to the ADC output for applying a linear inverse model of a forward path through the DAC circuit, the analog uptilt circuit, the PA circuit, and the ADC circuit, to produce a resulting signal $z_2$ that is combined with the signal $z_1$ for adaptively weighting the equalizer circuit.

Example 7 can include or use, or can optionally be combined with the subject matter of one or any combination of Examples 1-6, to optionally include or use a PA circuit that can be controlled to operate outside of the non-linear gain region such that a gain compression factor is below a specified threshold value when in the training mode of the equalizer circuit.

Example 8 can include or use, or can optionally be combined with the subject matter of one or any combination of Examples 1-7, to optionally include or use the reference Tx-Rx model of a desired system response including a flat gain, a linear phase response, and a constant group delay over a specified operating frequency band (e.g., such as a frequency band specified for cable television network communications, for example, providing a flat gain response (e.g., without ripple) up to 1.2 GHz with a first order finite impulse response (FIR) filter response rolloff for frequencies above 1.2 GHz).

Example 9 can include or use, or can optionally be combined with the subject matter of one or any combination of Examples 1-8, to optionally include or use the digital uptilt circuit including a training mode in which the highpass frequency response of the digital uptilt circuit can be selected, including by applying, to a signal output from the equalizer circuit, a linear forward model of a reverse path through the ADC circuit, the PA circuit, the analog uptilt circuit, and the DAC circuit.

Example 10 can include or use, or can optionally be combined with the subject matter of one or any combination of Examples 1-9, to optionally include or use the PA circuit being controlled to operate outside of the non-linear gain region, for example, such that a gain compression factor is below a specified threshold value when in the training mode of the digital uptilt circuit.

Example 11 can include or use, or can optionally be combined with the subject matter of one or any combination of Examples 1-10, to optionally include or use an analog-to-digital converter (ADC) circuit including an ADC input coupled to the PA output, and including an ADC output. A reference Tx-Rx model of a desired system response can be applied to a signal output from the equalizer circuit to produce a resulting signal $z_1$. A non-linear inverse model can be included, including an input coupled to the ADC output for applying a non-linear inverse model of a forward path through the equalizer circuit, the DAC circuit, the analog uptilt circuit, the PA circuit, and the ADC circuit, to produce a resulting signal $z_2$. The DPD circuit can include a training mode in which $z_1$ and $z_2$ can be combined, such as to select the nonlinear digital predistortion to compensate for the nonlinear gain compression of the PA circuit.

Example 12 can include or use, or can optionally be combined with the subject matter of one or any combination of Examples 1-11, to optionally include or use the frequency-selective digital uptilt circuit including a first digital uptilt circuit to emulate a highpass frequency response of the analog uptilt circuit. A second digital uptilt circuit can be included, such as can include a highpass frequency response selected to further compensate for a component of the lowpass frequency response of the cable communications load, which can be measured after the cable communications load is coupled to the PA circuit output.

Example 13 can include or use, or can optionally be combined with the subject matter of one or any combination of Examples 1-12, to optionally include or use a gain precision of the analog uptilt circuit that can be specified more coarsely than a gain precision of the second digital uptilt circuit.

Example 14 can include or use, or can optionally be combined with the subject matter of one or any combination of Examples 1-13, to optionally include or use the equalizer circuit, the DMD circuit, and the first digital uptilt circuit each including respective training modes. The DMD circuit training mode can be configured to recur more frequently than at least one of the equalizer circuit training mode and the first digital uptilt circuit training mode.

Example 15 can include or use, or can optionally be combined with the subject matter of one or any combination of Examples 1-12, to optionally include or use a method of driving a cable communications load having a lowpass frequency response. The method can include: receiving a digital input signal; applying a nonlinear digital predistortion to a signal based on the digital input signal to produce a digitally predistorted signal; applying an analog uptilt frequency response to a signal based on the digitally predistorted signal to compensate for the lowpass frequency response of the cable communications load, to produce an uptilted predistorted signal; and driving the cable communications load with a signal based on the uptilted predistorted signal.

Example 16 can include or use, or can optionally be combined with the subject matter of one or any combination of Examples 1-15, to optionally include: applying a digital uptilt frequency filtering to the digital input signal to produce a digitally uptilted signal; applying a digital predistortion to the digitally uptilted signal to produce a the digitally predistorted signal signal; applying an equalization to the digitally predistorted signal to compensate for the digitally uptilt frequency filtering to produce a digital equalized signal; converting the equalized signal from digital to analog to produce an analog equalized signal; applying an analog uptilt frequency filtering to the analog equalized signal to produce an analog equalized uptilted signal; and applying the analog equalized uptilted signal to a power amplifier to provide power amplification for driving the cable communications load.

Example 17 can include or use, or can optionally be combined with the subject matter of one or any combination of Examples 1-16, to optionally include a dynamic range of the digital equalized signal being equivalent to a dynamic range present without applying uptilting.

Example 18 can include or use, or can optionally be combined with the subject matter of one or any combination of Examples 1-17, to optionally include training the equalization in a training mode, such as in which a lowpass frequency response of the equalization can be selected to compensate for a highpass frequency response of the digital uptilt frequency filtering.

Example 19 can include or use, or can optionally be combined with the subject matter of one or any combination of Examples 1-18, to optionally include: applying a reference Tx-Rx model of a desired system response to a signal output from the equalization to produce a resulting signal $z_1$; and applying a linear inverse model of a forward path through a digital-to-analog conversion, an analog uptilt, a power amplifier (PA), and an analog-to-digital conversion, to produce a resulting signal $z_2$ that can be combined with the signal $z_1$ for adaptively weighting the equalization.

Example 20 can include or use, or can optionally be combined with the subject matter of one or any combination of Examples 1-19, to optionally include controlling the power amplification to operate outside of a nonlinear gain region, for example, such that the gain compression factor is below a specified threshold value when in the training mode of the equalization.

Example 21 can include or use, or can optionally be combined with the subject matter of one or any combination of Examples 1-20, to optionally include the reference Tx-Rx model of a desired system response including a flat gain, a linear phase response, and a constant group delay over a specified operating frequency band (e.g., such as a frequency band specified for cable television network communications, for example, providing a flat gain response (e.g., without ripple) up to 1.2 GHz with a first order finite impulse response (FIR) filter response rolloff for frequencies above 1.2 GHz).

Example 22 can include or use, or can optionally be combined with the subject matter of one or any combination of Examples 1-21, to optionally include the digital uptilt including a training mode in which the highpass frequency response of the digital uptilt being selected, such as including by applying, to a signal output from the equalization, a linear forward model of a reverse path through an analog-to-digital conversion, a power amplification, an analog uptilt, and the digital-to-analog conversion.

Example 23 can include or use, or can optionally be combined with the subject matter of one or any combination of Examples 1-22, to optionally include controlling a power amplification to operate outside of a nonlinear gain region, for example, such that a gain compression factor is below a specified threshold value when in the training mode of the digital uptilt.

Example 24 can include or use, or can optionally be combined with the subject matter of one or any combination of Examples 1-23, to optionally include: performing an analog-to-digital conversion (ADC) on a signal output from the power amplification; applying a reference Tx-Rx model of a desired system response, to a signal output from the equalization to produce a resulting signal $z_1$; applying a non-linear inverse model of a forward path through the equalization, the DAC, the analog uptilt, the PA, and the ADC, to produce a resulting signal $z_2$; and wherein the DPD includes a training mode in which $z_1$ and $z_2$ are combined to select the nonlinear digital predistortion to compensate for the nonlinear gain compression of the PA.

Example 25 can include or use, or can optionally be combined with the subject matter of one or any combination of Examples 1-24, to optionally include: using the frequency-selective digital uptilt to emulate a highpass frequency response of the analog uptilt; and further applying a second digital having a highpass frequency response selected to further compensate for a component of the lowpass frequency response of the cable communications load measured after the cable communications load is coupled to the PA circuit output.

Example 26 can include or use, or can optionally be combined with the subject matter of one or any combination of Examples 1-25, to optionally include using a gain precision of the analog uptilt that can be specified more coarsely than a gain precision of the second digital uptilt.

Example 27 can include or use, or can optionally be combined with the subject matter of one or any combination of Examples 1-26, to optionally include the equalization, the DPD, and the first digital uptilt each including respective training modes. For example, the DPD training mode can recur more frequently than at least one of the equalizer training mode and the first digital uptilt training mode.

Each of these non-limiting examples can stand on its own, or can be combined in various permutations or combinations with one or more of the other examples.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques (e.g., methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation. Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices, magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The claimed invention is:

1. A system, configured to drive a wired load, the system comprising:
    a frequency-selective analog circuit, including an analog circuit input to receive a digitally pre-distorted signal, and an analog circuit output configured to be coupled to the load;
    a digital-predistortion (DPD) circuit, including a DPD input and including a DPD output coupled to the analog circuit input, the DPD circuit configured to apply a nonlinear digital predistortion to an input signal received at the DPD input to provide, at the DPD output, the digitally pre-distorted signal to the analog circuit input based on feedback from a signal downstream from the frequency-selective analog circuit;
    a frequency-selective digital circuit, including a digital circuit input to receive a digital input signal, the digital circuit having a frequency response selected to emulate a frequency response of the frequency-selective analog circuit, and having a digital circuit output coupled to the DPD input; and
    a frequency selective equalizer circuit, including an equalizer input coupled to the DPD output, and an equalizer output coupled to the analog circuit input.

2. The system of claim 1, comprising:
    a digital-to-analog converter (DAC) circuit, including a digital DAC input coupled to the DPD output and an analog DAC output coupled to the analog circuit input;
    a power amplifier (PA) circuit, including a PA input coupled to the analog circuit output, and a PA output configured to drive the load, the PA circuit including a nonlinear gain compression as a PA circuit output power level increases.

3. The system of claim 2, wherein a dynamic range at the DAC input is maintained at a level that is equivalent to a dynamic range present without uptilt in the system.

4. The system of claim 2,
wherein:
the wired load is a cable communications load;
the frequency selective analog circuit includes a frequency-selective analog uptilt circuit, including a highpass frequency response selected to compensate for a lowpass frequency response of the cable communications load; and
the frequency selective digital circuit includes a frequency selective digital uptilt circuit, including a digital uptilt input to receive the digital input signal, the digital uptilt circuit having a highpass frequency response selected to emulate a highpass frequency response of the analog uptilt circuit, and having a digital uptilt output coupled to the DPD input.

5. The system of claim 4, wherein the equalizer circuit includes a training mode in which the lowpass frequency response of the equalizer circuit is selected to compensate for the highpass frequency response of the digital uptilt circuit including by applying a reference Tx-Rx model of a desired system response to a signal output from the equalizer circuit to produce a resulting signal $z_1$.

6. The system of claim 5, comprising:
an analog-to-digital converter (ADC) circuit including an ADC input coupled to the PA output, and including an ADC output;
a linear inverse model, stored in a memory, including an input coupled to the ADC output for applying a linear inverse model of a forward path through the DAC circuit, the analog uptilt circuit, the PA circuit, and the ADC circuit, to produce a resulting signal $z_2$ that is combined with the signal $z_1$ for adaptively weighting the equalizer circuit.

7. The system of claim 5, wherein the PA circuit is controlled to operate outside of a non-linear gain region such that a gain compression factor is below a specified threshold value when in the training mode of the equalizer circuit.

8. The system of claim 5, wherein the reference Tx-Rx model of a desired system response includes a flat gain, a linear phase response, and a constant group delay over a specified operating frequency band.

9. The system of claim 4, wherein the digital uptilt circuit includes a training mode in which the highpass frequency response of the digital uptilt circuit is selected, including by applying, to a signal output from the equalizer circuit, a linear forward model of a reverse path through an analog-to-digital converter (ADC) circuit, the PA circuit, the analog uptilt circuit, and the DAC circuit.

10. The system of claim 9, wherein the PA circuit is controlled to operate outside of a non-linear gain region.

11. The system of claim 4, comprising:
an analog-to-digital converter (ADC) circuit including an ADC input coupled to the PA output, and including an ADC output;
a reference Tx-Rx model of a desired system response, applied to a signal output from the equalizer circuit to produce a resulting signal $z_1$;
a non-linear inverse model, including an input coupled to the ADC output for applying a non-linear inverse model of a forward path through the equalizer circuit, the DAC circuit, the analog uptilt circuit, the PA circuit, and the ADC circuit, to produce a resulting signal $z_2$; and
wherein the DPD circuit includes a training mode in which $z_1$ and $z_2$ are combined to select the nonlinear digital predistortion to compensate for the nonlinear gain compression of the PA.

12. The system of claim 4, wherein the frequency-selective digital uptilt circuit is a first digital uptilt circuit to emulate a highpass frequency response of the analog uptilt circuit, and further comprising a second digital uptilt circuit, a highpass frequency response selected to further compensate for a component of the lowpass frequency response of the cable communications load measured after the cable communications load is coupled to the PA circuit output.

13. The system of claim 12, wherein a gain precision of the analog uptilt circuit is specified more coarsely than a gain precision of the second digital uptilt circuit.

14. The system of claim 4, wherein the equalizer circuit, the DPD circuit, and the digital uptilt circuit each include respective training modes, wherein the DPD circuit training mode recurs more frequently than at least one of an equalizer circuit training mode and the digital uptilt circuit training mode.

15. A method of driving a wired load, the method including:
receiving a digital input signal;
applying a digital frequency filtering to the digital input signal to produce a digitally frequency modified signal, wherein the digital frequency filtering is to emulate an analog frequency modification to be applied downstream;
applying a nonlinear digital predistortion (DPD) to a signal based on the digital frequency-modified signal to produce a digitally predistorted signal;
applying an equalization to the digitally predistorted signal to compensate for the digital frequency filtering to produce a digital equalized signal;
applying an analog frequency modification to a signal based on the digitally equalized signal, to produce an analog equalized frequency-modified predistorted signal;
applying feedback to the nonlinear digital predistortion based on a signal downstream from the applied analog frequency modification; and
driving the load with a signal based on the analog equalized frequency-modified predistorted signal.

16. The method of claim 15, comprising:
performing a digital-to-analog conversion (DAC) on the digital equalized signal to produce the analog equalized frequency-modified pre-distorted signal; and
applying the analog equalized frequency-modified pre-distorted signal to a power amplifier (PA) to provide power amplification for driving the load; and
wherein applying the digital frequency filtering includes applying a digital uptilt frequency filtering to the digital input signal; and
wherein applying the analog frequency modification includes applying an analog uptilt frequency filtering to produce the analog equalized frequency-modified pre-distorted signal.

17. The method of claim 16, wherein a dynamic range of the digital equalized signal is equivalent to a dynamic range present without applying uptilting.

18. The method of claim 16, comprising:
training the equalization in a training mode in which a lowpass frequency response of the equalization is selected to compensate for a highpass frequency response of the digital uptilt frequency filtering.

19. The method of claim 18, comprising:
applying a reference Tx-Rx model of a desired system response to a signal output from the equalization to produce a resulting signal $z_1$; and
applying a linear inverse model of a forward path through a digital-to-analog conversion, the analog uptilt frequency filtering, the PA, and an analog-to-digital conversion, to produce a resulting signal $z_2$ that is combined with the signal $z_1$ for adaptively weighting the equalization.

20. The method of claim 18, comprising:
controlling the power amplification to operate outside of a nonlinear gain region such that the gain compression factor is below a specified threshold value when in the training mode of the equalization.

21. The method of claim 19, wherein the reference Tx-Rx model of a desired system response includes a flat gain, a linear phase response, and a constant group delay over a specified operating frequency band.

22. The method of claim 16, wherein the digital uptilt frequency filtering includes a training mode in which the highpass frequency response of the digital uptilt is selected, including by applying, to a signal output from the equalization, a linear forward model of a reverse path through an analog-to-digital conversion, the power amplification, the analog uptilt frequency filtering, and the DAC.

23. The method of claim 22, comprising controlling the power amplification to operate outside of a nonlinear gain region such that a gain compression factor is below a specified threshold value when in the training mode of the digital uptilt frequency filtering.

24. The method of claim 16, comprising:
performing an analog-to-digital conversion (ADC) on a signal output from the power amplification;
applying a reference Tx-Rx model of a desired system response, to a signal output from the equalization to produce a resulting signal $z_1$;
applying a non-linear inverse model of a forward path through the equalization, the DAC, the analog uptilt frequency filtering, the PA, and an analog to digital conversion (ADC), to produce a resulting signal $z_2$; and
wherein the DPD includes a training mode in which $z_1$ and $z_2$ are combined to select the nonlinear digital predistortion selected to compensate for the nonlinear gain compression of the PA.

25. The method of claim 16, comprising:
using the digital uptilt frequency filtering to emulate a highpass frequency response of the analog uptilt frequency filtering; and
further applying a second digital uptilt having a highpass frequency response selected to further compensate for a component of the lowpass frequency response of the load measured after the cable communications load is coupled to the PA circuit output.

26. The method of claim 25, comprising:
using a gain precision of the analog uptilt frequency filtering that is specified more coarsely than a gain precision of the second digital uptilt.

27. The method of claim 16, wherein the equalization, the DPD, and the digital uptilt frequency filtering each include respective training modes, wherein the DPD training mode recurs more frequently than at least one of an equalizer training mode and the digital uptilt frequency filtering training mode.

28. The method of claim 4, wherein the frequency selective equalizer circuit, includes a lowpass frequency response selected to compensate for the highpass frequency response of the digital uptilt circuit, and an equalizer output that is coupled to an input of the analog uptilt circuit.

* * * * *